(12) United States Patent
Minoura et al.

(10) Patent No.: US 9,034,722 B2
(45) Date of Patent: May 19, 2015

(54) METHOD OF REMOVING A COMPOUND SEMICONDUCTOR LAYER FROM A COMPOUND SEMICONDUCTOR DEVICE

(75) Inventors: Yuichi Minoura, Kawasaki (JP); Toshihide Kikkawa, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 616 days.

(21) Appl. No.: 12/845,292

(22) Filed: Jul. 28, 2010

(65) Prior Publication Data
US 2011/0024799 A1 Feb. 3, 2011

(30) Foreign Application Priority Data
Aug. 3, 2009 (JP) ................................. 2009-181090

(51) Int. Cl.
*H01L 21/268* (2006.01)
*H01L 21/306* (2006.01)
(Continued)

(52) U.S. Cl.
CPC ....... *H01L 21/30617* (2013.01); *H01L 21/0331* (2013.01); *B82Y 20/00* (2013.01); *H01L 21/0242* (2013.01); *H01L 21/02458* (2013.01); *H01L 21/02502* (2013.01); *H01L 21/0254* (2013.01); *H01L 21/02664* (2013.01); *H01L 29/0696* (2013.01); *H01L 29/2003* (2013.01); *H01L 29/402* (2013.01); *H01L 29/41758* (2013.01);
(Continued)

(58) Field of Classification Search
CPC ....................... H01L 21/02502; H01L 21/0331
USPC ........... 257/201, E29.091, E21.403; 438/172, 438/408
See application file for complete search history.

(56) References Cited

U.S. PATENT DOCUMENTS

2003/0089906 A1* 5/2003 Ueda ............................... 257/55
2005/0040425 A1* 2/2005 Akita ............................ 257/103
(Continued)

FOREIGN PATENT DOCUMENTS

JP 2003-218087 A 7/2003
JP 2006-60200 A 3/2006
(Continued)

OTHER PUBLICATIONS

English machine translation of JP2006-080274 to Orita.*
(Continued)

*Primary Examiner* — Matthew Reames
*Assistant Examiner* — Christopher M Roland
(74) *Attorney, Agent, or Firm* — Westerman, Hattori, Daniels & Adrian, LLP

(57) ABSTRACT

A method for manufacturing a compound semiconductor device so as to separate a first substrate from a compound semiconductor laminated structure which includes forming a first compound semiconductor layer over a first substrate containing $Al_xGa_{1-x}N$ ($0 \le x < 1$) and having a first band gap; forming a second compound semiconductor layer over the first compound semiconductor layer containing $Al_yIn_zGa_{1-y-z}N$ ($0 < y < 1$, $0 < y+z \le 1$) and having a second band gap larger than the first band gap; forming a compound semiconductor laminated structure over the second compound semiconductor layer; and removing the first compound semiconductor layer while irradiating the first compound semiconductor layer with light having an energy between the first band gap and the second band gap, and thereby separating the first substrate from the compound semiconductor laminated structure.

13 Claims, 44 Drawing Sheets

(51) Int. Cl.

| | | |
|---|---|---|
| B82Y 20/00 | (2011.01) | |
| H01L 29/06 | (2006.01) | |
| H01L 29/40 | (2006.01) | |
| H01L 29/417 | (2006.01) | |
| H01L 29/66 | (2006.01) | |
| H01L 29/778 | (2006.01) | |
| H01L 21/033 | (2006.01) | |
| H01L 21/02 | (2006.01) | |
| H01L 29/20 | (2006.01) | |
| H01S 5/02 | (2006.01) | |
| H01S 5/024 | (2006.01) | |
| H01S 5/343 | (2006.01) | |

(52) U.S. Cl.
CPC ...... *H01L 29/66462* (2013.01); *H01L 29/7787* (2013.01); *H01L 29/7788* (2013.01); *H01S 5/0201* (2013.01); *H01S 5/0216* (2013.01); *H01S 5/0217* (2013.01); H01S 5/02476 (2013.01); H01S 5/34333 (2013.01)

(56) References Cited

U.S. PATENT DOCUMENTS

2006/0189017 A1    8/2006   Nogami
2007/0164306 A1*   7/2007   Nakahata et al. ............. 257/103
2009/0061576 A1    3/2009   Okamoto
2009/0078943 A1    3/2009   Ishida et al.

FOREIGN PATENT DOCUMENTS

| JP | 2006-080274 A | 3/2006 |
| JP | 2007-227450 A | 9/2007 |
| JP | 2009-76694 A | 4/2009 |
| WO | 2007/105281 A1 | 9/2007 |

OTHER PUBLICATIONS

Gao, Y. et al., "AlGaN/GaN current aperture vertical electron transistors fabricated by photoelectrochemical wet etching", Electronics Letters, Jan. 9, 2003, pp. 148-149, vol. 39 No. 1.

Grenko, J. A. et al., "Selective Etching of GaN from AlGaN/GaN and AlN/GaN Structures", MRS Internet Journal of Nitride Semiconductor Research, Jul. 2004, pp. 1-12, vol. 9 Article 5.

Japanese Office Action dated Jan. 7, 2014, issued in Japanese Patent Application No. 2009-181090, w/English partial translation, (7 pages).

Japanese Office Action dated Aug. 5, 2014, issued in corresponding JP application No. 2009-181090 with English Abstract (5 pages).

\* cited by examiner

METHOD OF REMOVING A COMPOUND SEMICONDUCTOR LAYER FROM A COMPOUND SEMICONDUCTOR DEVICE

CROSS-REFERENCE TO RELATED APPLICATIONS

This application is based upon and claims the benefit of priority of the prior Japanese Patent Application No. 2009-181090, filed on Aug. 3, 2009, the entire contents of which are incorporated herein by reference.

FIELD

The present invention relates to a compound semiconductor device and a method of manufacturing a compound semiconductor device.

BACKGROUND

In recent years, nitride semiconductors such as GaN have been receiving attention as materials for high-withstand-voltage high-speed devices. Examples of the high-withstand-voltage high-speed devices include field-effect transistors (FETs), in particular, high-electron-mobility transistors (HEMTs). In the case of the manufacturing a GaN-based HEMT, a nitride layer, for example, a GaN layer, an AlGaN layer, or an AlN layer, is grown over a SiC substrate, a sapphire substrate, a GaN substrate, or the like.

A substrate for a compound semiconductor device including a nitride semiconductor such as a GaN-based HEMT is required to achieve satisfactory lattice matching to a nitride semiconductor layer such as a GaN layer and have high heat-dissipating properties. Furthermore, in the case of a structure in which electrodes are arranged over front and back surfaces of the substrate, i.e., in the case of a vertical structure, the substrate may be required to have conductivity. However, a sapphire substrate has low heat-dissipating properties and low conductivity. A SiC substrate and a GaN substrate exhibit high heat-dissipating properties but are very expensive.

Thus, a method including forming a nitride semiconductor layer using a substrate having satisfactory lattice matching to the nitride semiconductor layer, removing the substrate, and bonding a substrate having satisfactory heat-dissipating properties or a substrate having satisfactory heat-dissipating properties and conductivity has been studied. An example of a method for removing the substrate is a method including forming a sacrificial layer and an etching stopper layer on the substrate in advance, forming an element and so forth on the etching stopper layer, removing the sacrificial layer by photoelectrochemical etching, and separating the substrate from the etching stopper layer, the element, and so forth. The etching selection ratio of the sacrificial layer to the etching stopper layer and the level of the lattice matching of the etching stopper layer to the substrate are determined by materials thereof.

However, an increase in the etching selection ratio of the sacrificial layer to the etching stopper layer fails to form a thick etching stopper layer having satisfactory lattice matching to the substrate. Furthermore, the formation of a thick etching stopper layer having satisfactory lattice matching to the substrate reduces the etching selection ratio of the sacrificial layer to the etching stopper layer. It is thus difficult to appropriately remove the substrate.

The related art is described in the following references: Japanese Laid-open Patent Publication Nos. 2003-218087 and 2006-80274; Grenko J A, Reynolds Jr C L, Schlesser R, Bachmann K, Rietmeier Z, Davis R F and Sitar Z, "Selective Etching of GaN from AlGaN/GaN and AlN/GaN Structures", MRS Internet J. Nitride Semicond. Res. 9 5 (2004); and Gao Y, Stonas A R, Ben-Yaacov I, Mishra U, DenBaars S P and Hu E L, "AlGaN/GaN current aperture vertical electron transistors fabricated by photoelectrochemical wet etching", Electron. Lett. Vol. 39 No. 1 148-149 (2003).

SUMMARY

According to an aspect of the invention, a method for manufacturing a compound semiconductor device includes forming a first compound semiconductor layer over a first substrate, the first compound semiconductor layer containing $Al_xGa_{1-x}N$ ($0 \leq x < 1$) having a first band gap; forming a second compound semiconductor layer over the first compound semiconductor layer, the second compound semiconductor layer containing $Al_yIn_zGa_{1-y-z}N$ ($0 < y < 1$, $0 < y+z \leq 1$) having a second band gap larger than the first band gap; forming a compound semiconductor laminated structure over the second compound semiconductor layer; and removing the first compound semiconductor layer while irradiating the first compound semiconductor layer with light having an energy between the first band gap and the second band gap, separating the first substrate from the compound semiconductor laminated structure.

According to another aspect of the invention, a compound semiconductor device includes a substrate; and a compound semiconductor laminated structure bonded over the substrate.

According to another aspect of the invention, a compound semiconductor device includes a compound semiconductor layer arranged over a substrate with an adhesive material, the compound semiconductor layer containing $Al_yIn_zGa_{1-y-z}N$ ($0 < y < 1$, $0 < y+z \leq 1$); and a nitride semiconductor layer arranged over the compound semiconductor layer, the nitride semiconductor layer has a composition different from the compound semiconductor layer.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

First Embodiment

Figure 1:
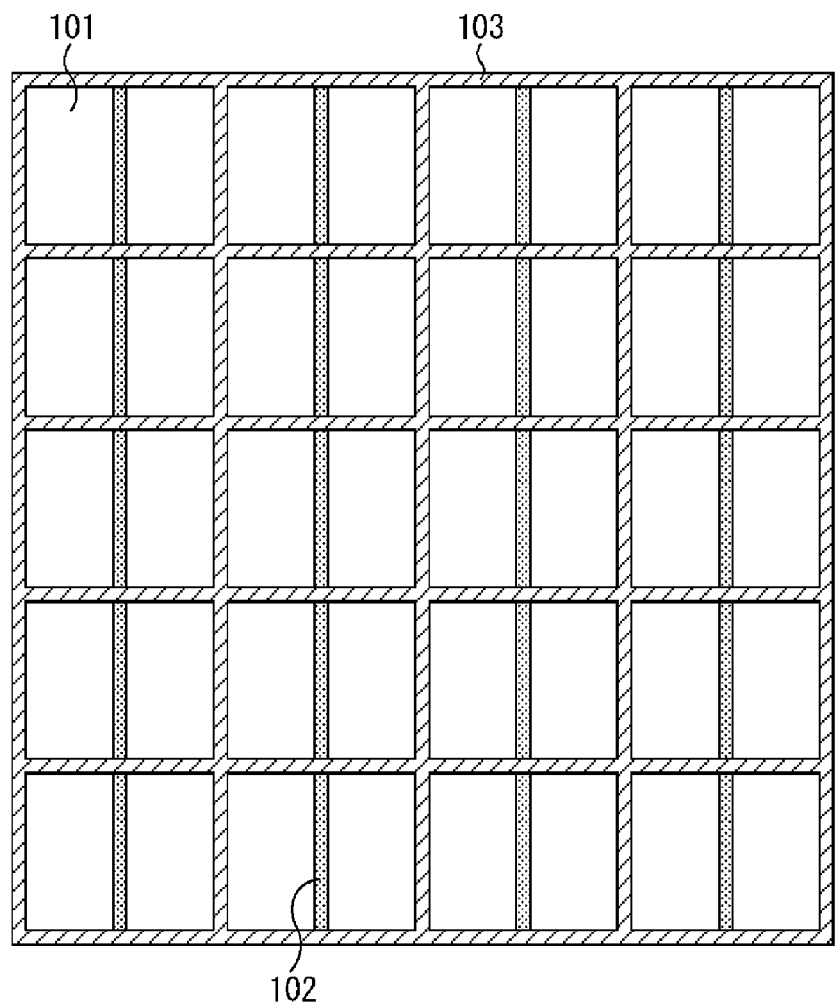
FIG. 1 illustrates a layout of a wafer according to a first embodiment.

In a first embodiment, as illustrated in FIG. 1, a substrate (wafer) is partitioned into transistor regions 101, penetrating groove regions 102, and electrode groove regions 103. HEMTs are formed in the transistor regions 101 as described below. Grooves are formed in the penetrating groove regions 102 as described below. An electrolytic solution is brought into contact with a sacrificial layer during photoelectrochemical etching through the grooves. Grooves are formed in the electrode groove regions 103. Electrodes are formed in the grooves. A predetermined electric potential is applied to the sacrificial layers during photoelectrochemical etching through the electrodes.

The penetrating groove regions 102 and the electrode groove regions 103 are arranged in, for example, dicing regions. That is, the plural transistor regions 101 are arrayed in a matrix. The penetrating groove regions 102 or the electrode groove regions 103 are arranged between two adjacent transistor regions 101. For example, the penetrating groove regions 102 and the electrode groove regions 103 are alternately arranged between the plural transistor regions 101 arranged in one direction (transverse direction). The electrode groove regions 103 are arranged between the plural transistor regions 101 arranged in a direction (longitudinal direction) perpendicular to the one direction.

Figure 2:
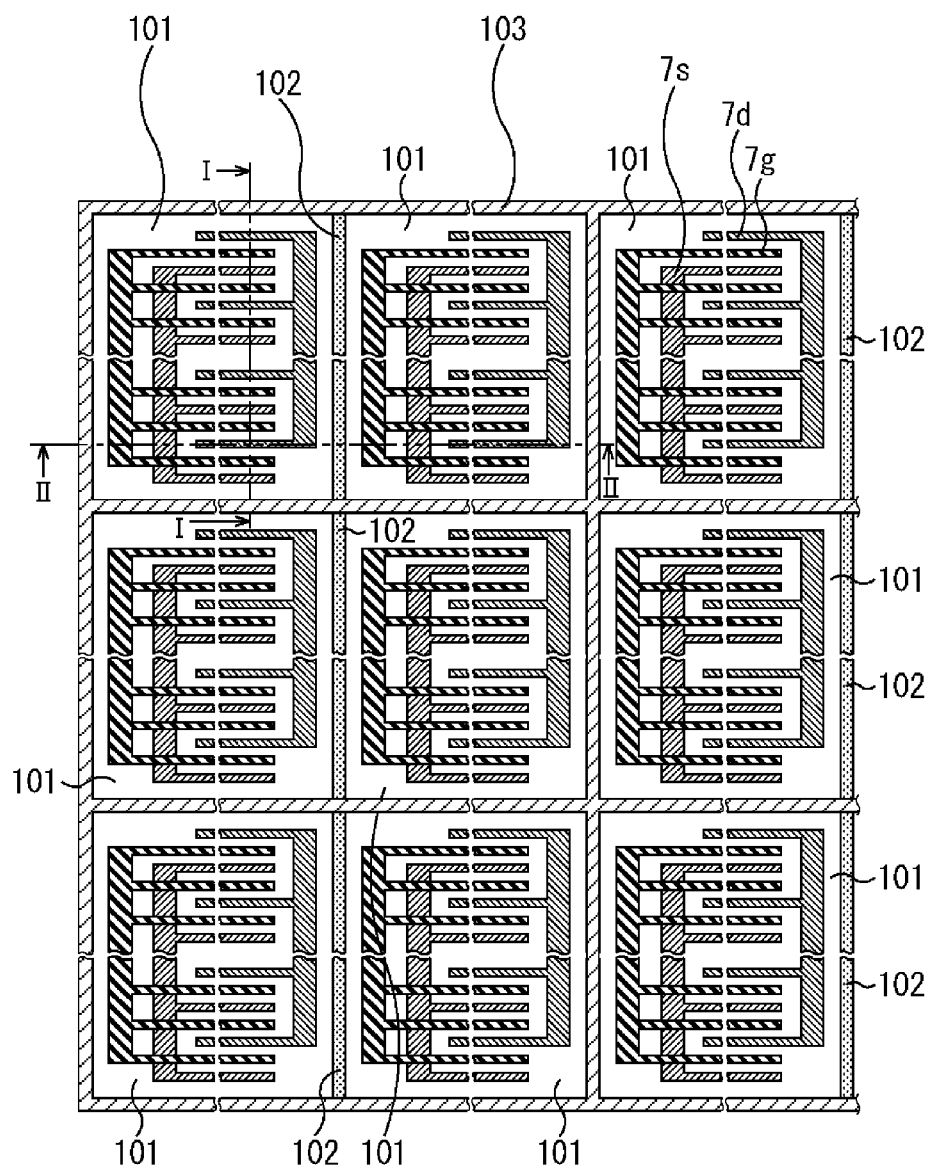
FIG. 2 illustrates the layout of electrodes of lateral HEMTs.

The layout of electrodes of the lateral HEMTs formed in the transistor regions 101 will be described below. FIG. 2 illustrates the layout of the electrodes of the lateral HEMTs. As illustrated in FIG. 2, a gate electrode 7g, a source electrode 7s, and a drain electrode 7d are formed in each of the transistor regions 101. Each of the gate electrode 7g, the source electrode 7s, and the drain electrode 7d has a comb shape in plan view. Electrode fingers of the source electrode 7s and the drain electrode 7d are alternately arranged. Electrode fingers of the gate electrode 7g are each arranged therebetween. The use of such a multi-finger gate structure improves the output.

Details of treatments in the first embodiment will be described below.

Figure 3A:
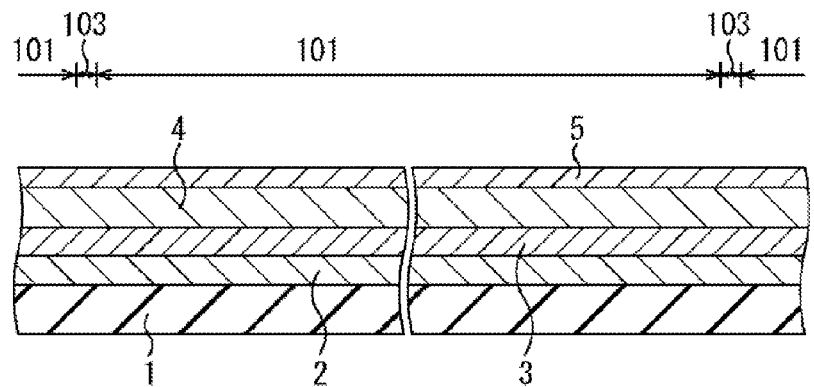
FIGS. 3A to 3N are cross-sectional views taken along line I-I in FIG. 2 and illustrate the method of manufacturing a compound semiconductor device according to the first embodiment.

As illustrated in FIG. 3A, a sacrificial layer 2, an etching stopper layer 3, an electron transport layer 4, and an electron supply layer 5 are formed over a substrate 1. For the formation of the sacrificial layer 2, the etching stopper layer 3, the electron transport layer 4, and the electron supply layer 5, crystal growth is performed by, for example, metal organic chemical vapor deposition (MOCVD). As the substrate 1, for example, a transparent sapphire substrate having polished front and back surfaces is used. As the sacrificial layer 2, for example, an n-GaN layer (n-type GaN layer) which has a thickness of 0.1 μm to 5 μm (e.g., about 2 μm) and which is doped with, for example, Si serving as an impurity at a concentration of about $1.5 \times 10^{18}$ cm$^{-3}$ is formed. The sacrificial layer 2 may include a GaN buffer sublayer grown at a low temperature of about 400° C. to 700° C. As the etching stopper layer 3, for example, an AlInN layer having a thickness of 0.1 μm to 5 μm (e.g., about 2 μm) is formed. The proportion of Al in the AlInN layer is set to, for example, about 73 atomic percent or more and about less than 100 atomic percent (e.g., about 83 atomic percent) with respect to the total amount of Al and In. As the electron transport layer 4, for example, an undoped GaN layer (i-GaN layer) having a thickness of 0.1 μm to 5 μm (e.g., about 2 μm) is formed. As the electron supply layer 5, for example, an n-type n-AlGaN layer (n-AlGaN layer) which has a thickness of 2 nm to 50 nm (e.g., about 30 nm) and which is doped with, for example, Si at a concentration of about $5 \times 10^{18}$ cm$^{-3}$ is formed.

Figure 3B:
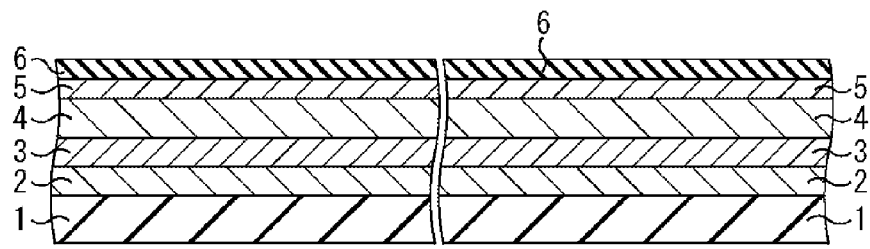

As illustrated in FIG. 3B, a passivation film 6 is formed over the electron supply layer 5. As the passivation film 6, for example, a silicon nitride film having a thickness of 5 nm to 500 nm (e.g., about 100 nm) is formed by CVD.

Figure 3C:
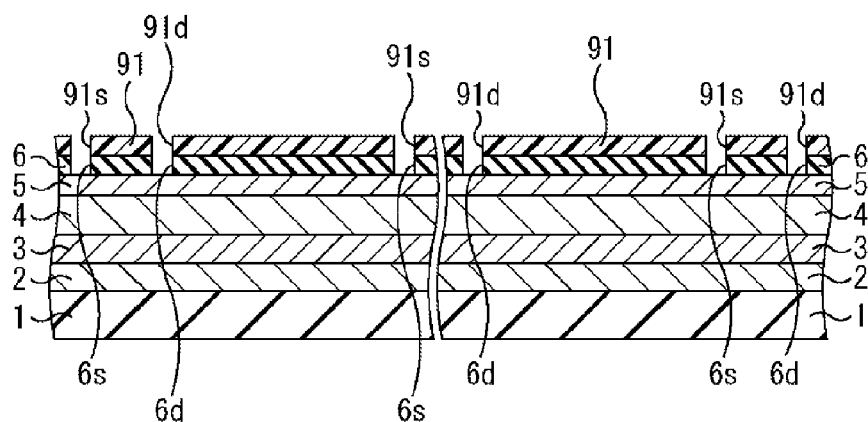

As illustrated in FIG. 3C, a resist pattern 91 is formed over the passivation film 6, the resist pattern 91 having openings 91s configured to form holes in regions where the source electrodes 7s will be formed and having openings 91d configured to form holes in regions where the drain electrodes 7d will be formed. The passivation film 6 is subjected to dry etching with the resist pattern 91 as a mask, thereby forming openings 6s in the regions of the passivation film 6 where the source electrodes 7s will be formed and forming openings 6d in the regions where the drain electrodes 7d will be formed.

Figure 3D:
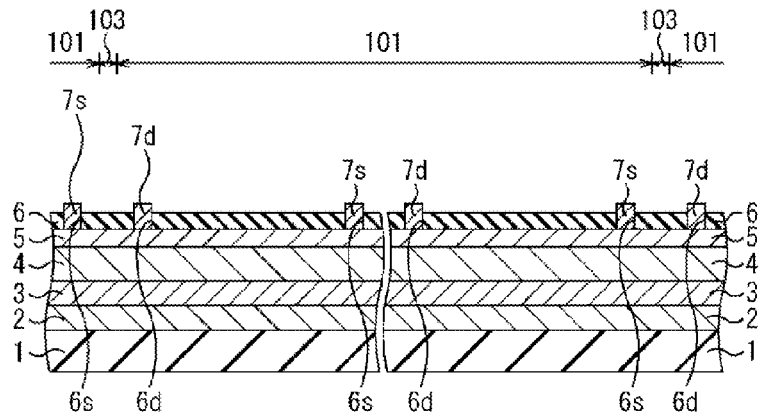

As illustrated in FIG. 3D, the source electrodes 7s are formed in the openings 6s by a lift-off method, and the drain electrodes 7d are formed in the openings 6d by the lift-off method. In the formation of the source electrodes 7s and the drain electrodes 7d, for example, a Ti film having a thickness of about 30 nm and an Al film having a thickness of about 100 nm are formed, by evaporation in the openings 6s and the openings 6d and over the resist pattern 91. The resist pattern 91 is removed together with the Ti film and the Al film provided thereon. Then, for example, heat treatment is performed in a nitrogen atmosphere at 400° C. to 1000° C. (e.g., about 600° C.). Thereby, ohmic properties of the source electrodes 7s and the drain electrodes 7d are established.

Figure 3E:
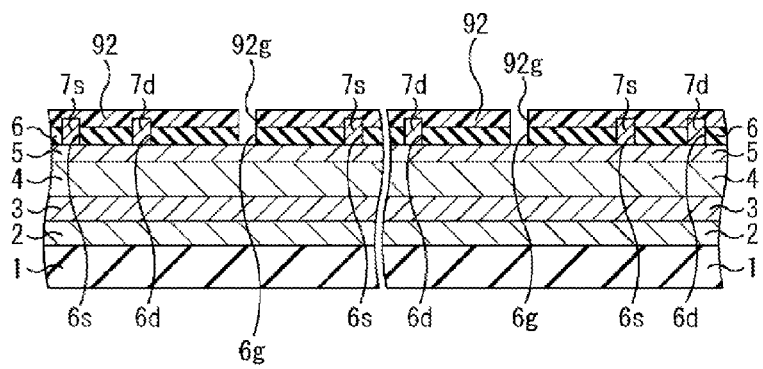

As illustrated in FIG. 3E, a resist pattern 92 is formed over the passivation film 6. The resist pattern 92 covers the source electrodes 7s and the drain electrodes 7d and has openings 92g configured to form holes in regions where the gate electrodes 7g will be formed. The passivation film 6 is subjected to dry etching with the resist pattern 92 as a mask, thereby forming openings 6g in the regions of the passivation film 6 where the gate electrode 7g will be formed.

Figure 3F:
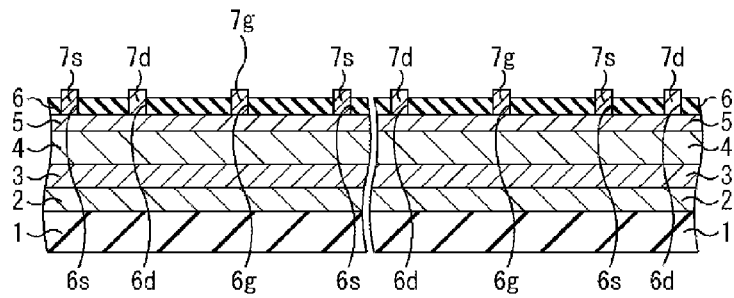

As illustrated in FIG. 3F, the gate electrodes 7g are formed in the openings 6g by the lift-off method. In the formation of the gate electrode 7g, for example, a Ni film having a thickness of about 10 nm and a Au film having a thickness of about 200 nm are formed by evaporation in the openings 6g and over the resist pattern 92. The resist pattern 92 is removed together with the Ni film and the Au film provided thereon.

Figure 3G:
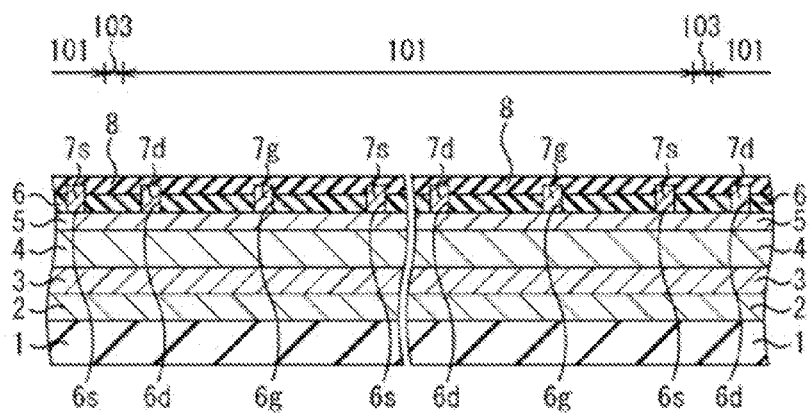

As illustrated in FIG. 3G, a passivation film 8 that covers the gate electrodes 7g, the source electrodes 7s, and the drain electrodes 7d is formed over the passivation film 6. As the passivation film 8, for example, a silicon nitride film having a thickness of 10 nm to 1000 nm (e.g., 500 nm) is formed by CVD.

Figure 3H:
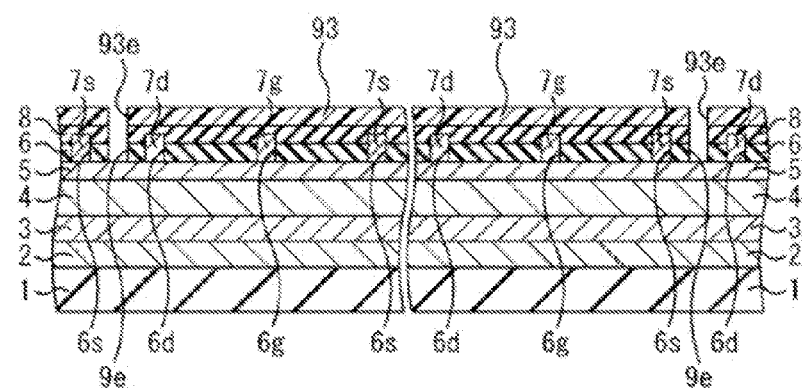
Figure 4A:
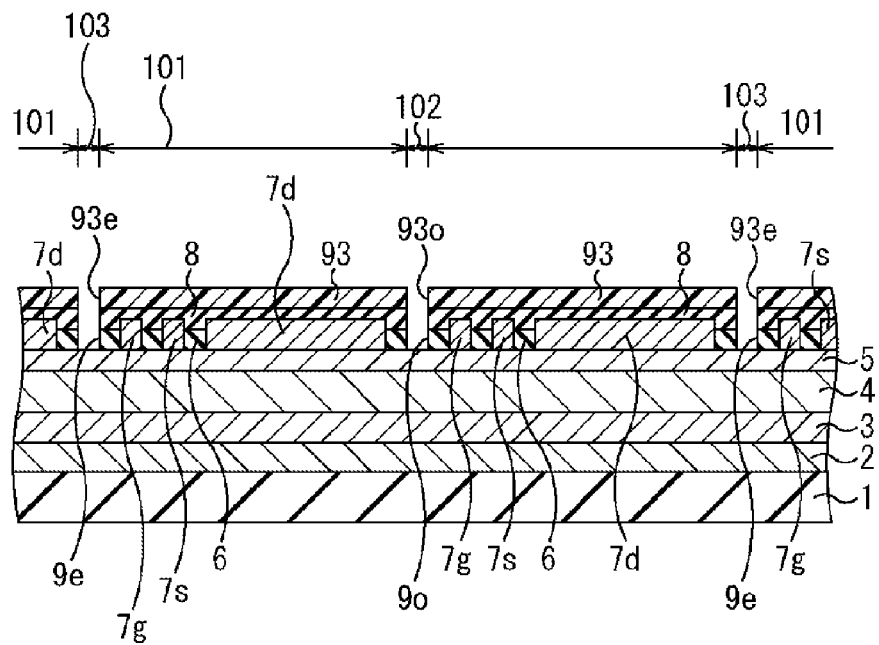
FIGS. 4A to 4G are cross-sectional views taken along line II-II in FIG. 2 and illustrate the method of manufacturing a compound semiconductor device according to the first embodiment.

As illustrated in FIGS. 3H and 4A, a resist pattern 93 is formed over the passivation film 8, the resist pattern 93 having openings 93o formed in the penetrating groove regions 102 and openings 93e formed in the electrode groove regions 103. The passivation films 8 and 6 are subjected to dry etching with the resist pattern 93 as a mask. Thereby, grooves 9o are formed in the penetrating groove regions 102 of the passivation films 8 and 6, and grooves 9e are formed in the electrode groove regions 103.

Figure 3I:
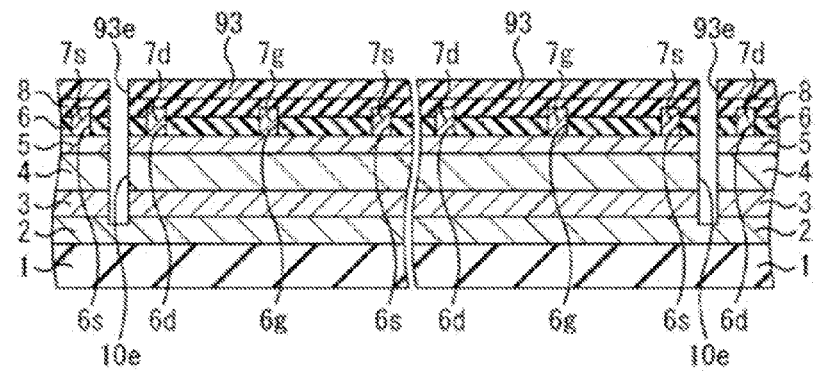
Figure 4B:
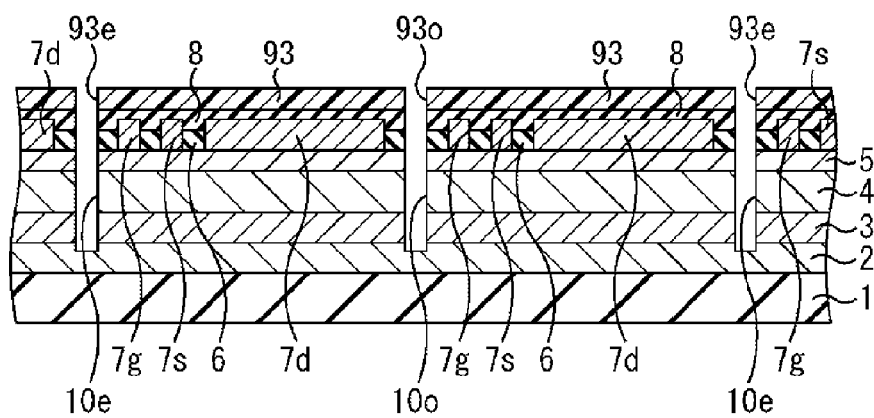

The electron supply layer 5, the electron transport layer 4, and the etching stopper layer 3 are subjected to dry etching with the resist pattern 93 as a mask. Thereby, as illustrated in FIGS. 3I and 4B, penetrating grooves 10o configured to allow the sacrificial layer 2 to be exposed therethrough are formed in the penetrating groove regions 102 of the electron supply layer 5, the electron transport layer 4, and the etching stopper layer 3, and electrode grooves 10e configured to allow the sacrificial layer 2 to be exposed are formed in the electrode groove regions 103. For example, the dry etching is performed with $Cl_2$ gas at an antenna power of about 200 W, a bias power of about 30 W, and a pressure of about 1 Pa.

Figure 3J:
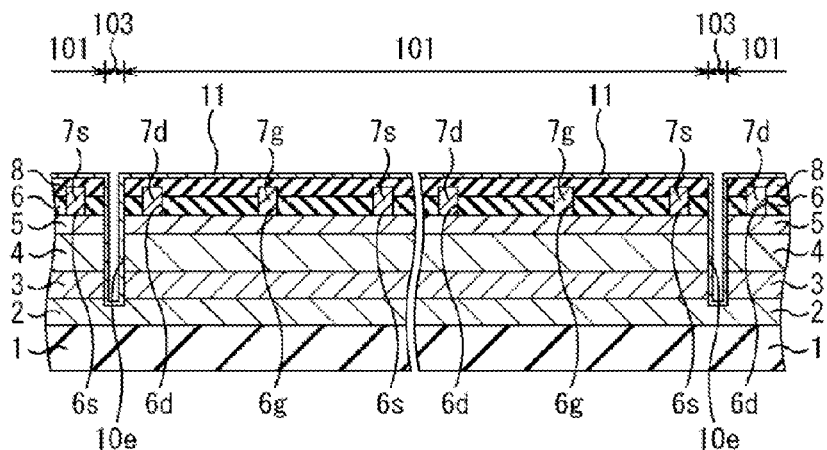
Figure 4C:
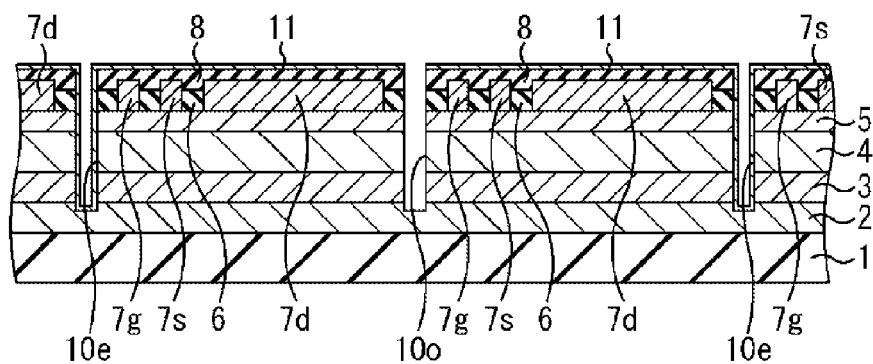

As illustrated in FIGS. 3J and 4C, a Ti film 11 is formed in the electrode grooves 10e and over the passivation film 8. The Ti film 11 is formed by, for example, the lift-off method so as not to be formed in the penetrating grooves 10o. The Ti film 11 has a thickness of, for example, 10 nm to 200 nm (e.g., about 100 nm). A Au film may be formed over the Ti film 11.

Figure 3K:
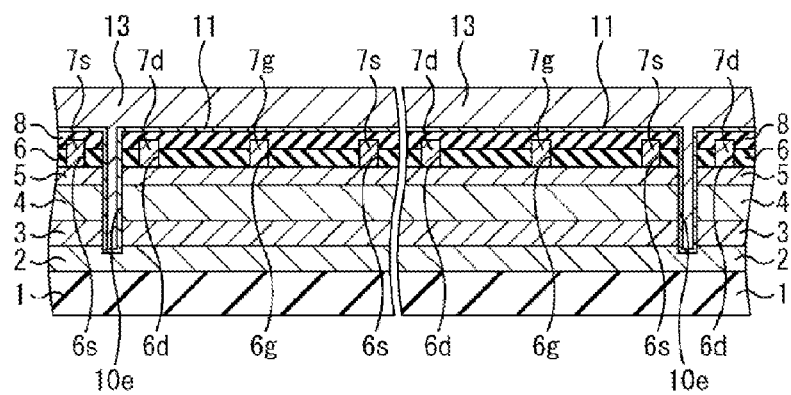
Figure 4D:
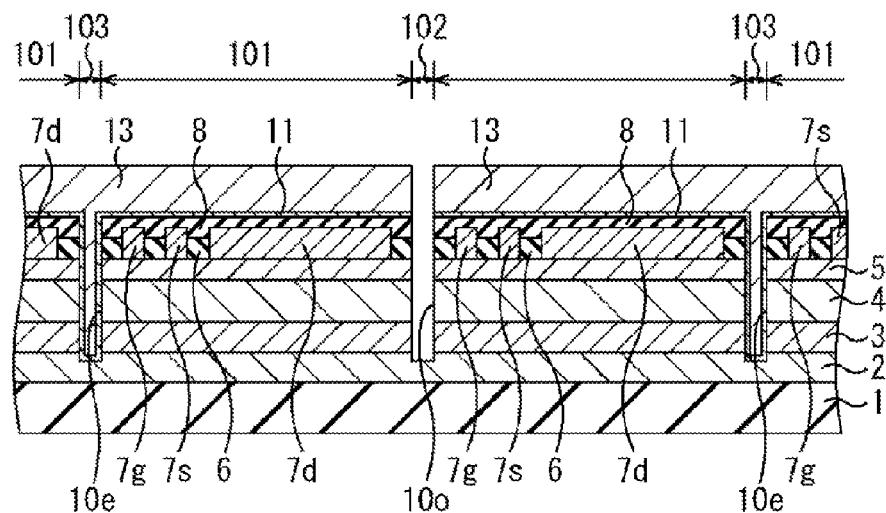

As illustrated in FIGS. 3K and 4D, for example, a Ni film 13 having a thickness of 1 μm to 500 μm (e.g., about 100 μm) is formed by, for example, plating over the Ti film 11. In the formation of the Ni film 13, a resist film may be formed in the penetrating grooves 10o in order not to contaminate the penetrating grooves 10o and would then removed after the formation of the Ni film 13.

Figure 3L:
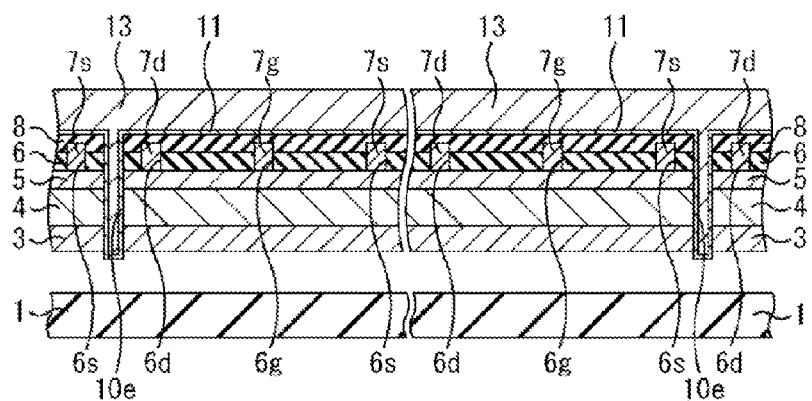
Figure 4E:
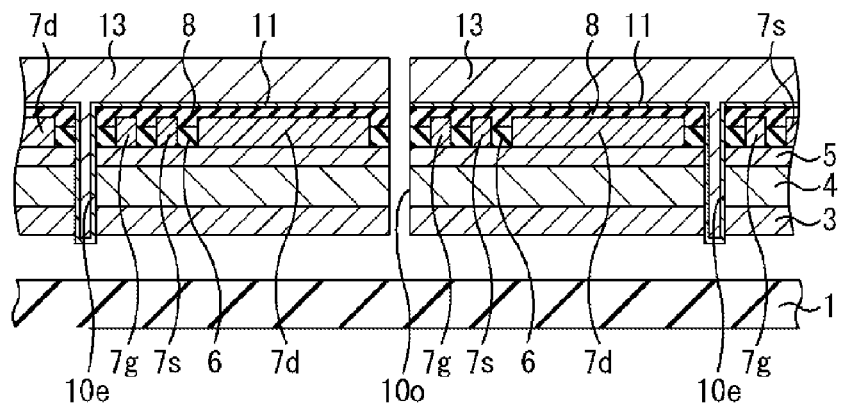

As illustrated in FIGS. 3L and 4E, the sacrificial layer 2 is removed by photoelectrochemical etching, separating the substrate 1 from the etching stopper layer 3. Details of the photoelectrochemical etching will be described below.

Figure 3M:
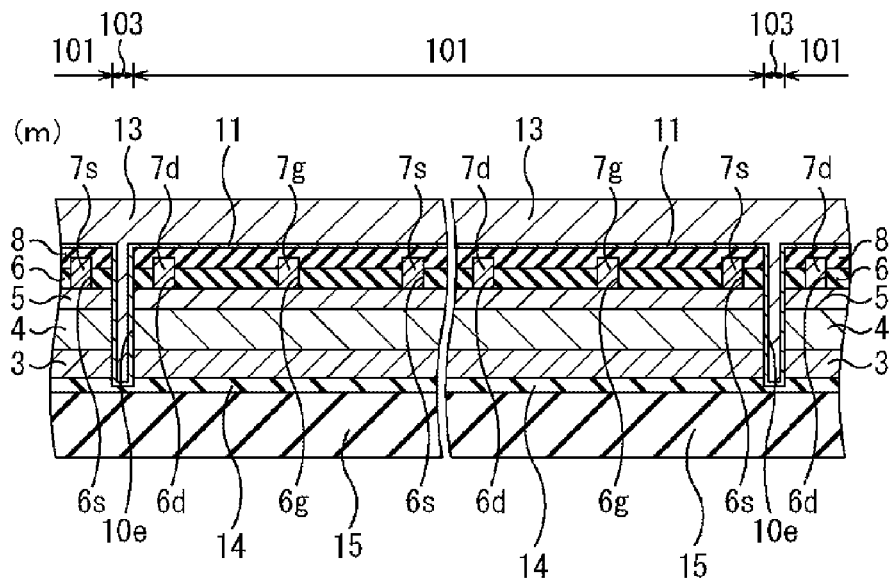
Figure 4F:
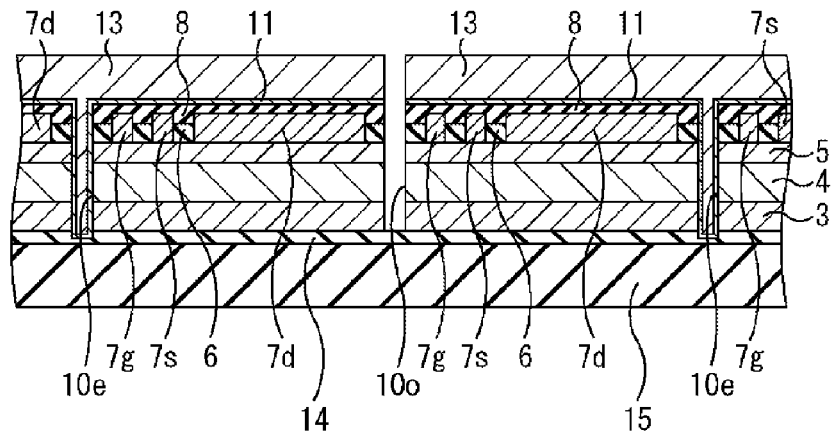

As illustrated in FIGS. 3M and 4F, a heat-dissipating substrate 15 having a higher thermal conductivity than the substrate 1 is bonded to the etching stopper layer 3 with an adhesive 14. The heat-dissipating substrate 15 may have a thermal conductivity of, for example, about 30 W/(m·K) or more. The heat-dissipating substrate 15 may be, for example, a polycrystalline SiC substrate. The heat-dissipating substrate 15 has a thickness of, for example, about 100 μm to about 1 mm. The adhesive 14 preferably has a high thermal conductivity.

Figure 3N:
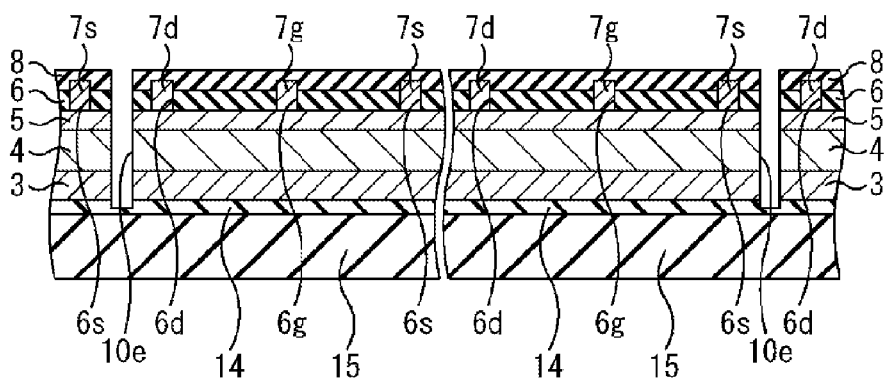
Figure 4G:
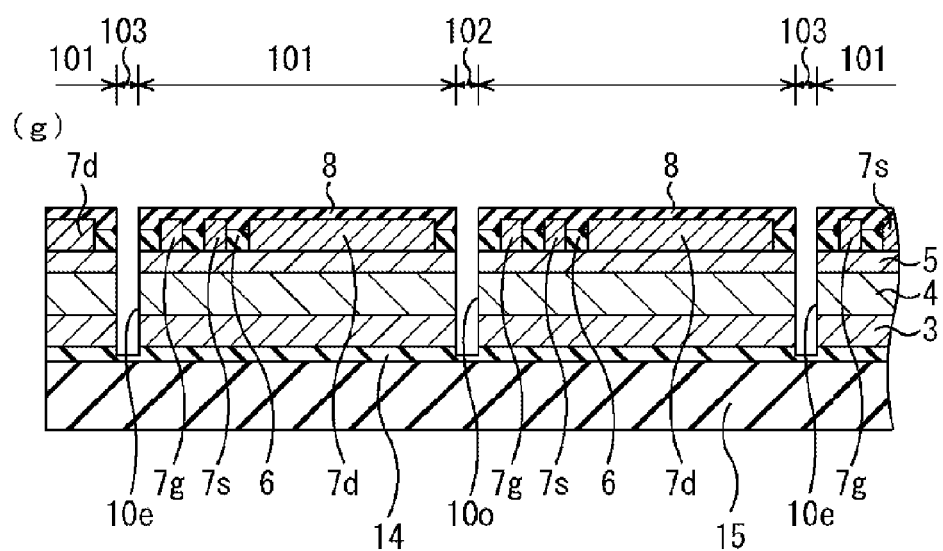

As illustrated in FIGS. 3N and 4G, the Ni film 13 and the Ti film 11 are removed. For example, the Ni film 13 and the Ti film 11 are removed by the use of a mixed solution of sulfuric acid and aqueous hydrogen peroxide. In the case where a Au film is formed on the Ti film 11, polishing may be performed in combination with the mixed solution. Wiring for the gate electrodes 7g, wiring for the source electrodes 7s, wiring for the drain electrodes 7d, and so forth are formed. Thereby, a compound semiconductor device is produced.

Figure 5:
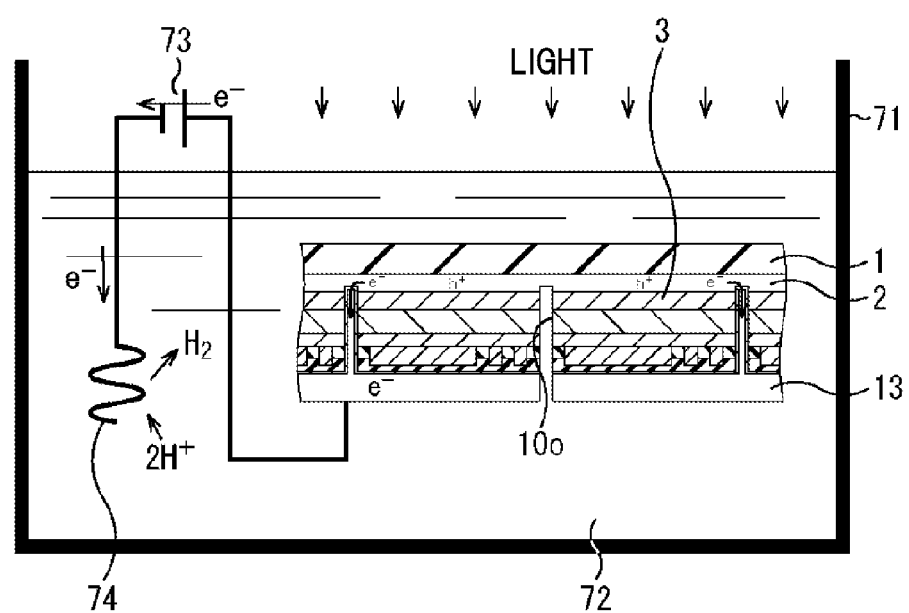
FIG. 5 is a schematic view illustrating a method of photoelectrochemical etching according to the first embodiment.

As illustrated in FIG. 5, the photoelectrochemical etching in this embodiment is described.

In the photoelectrochemical etching in the first embodiment, a potassium hydroxide (KOH) solution 72 is charged into a tank 71. The substrate 1 that has been subjected to the steps up to the formation of the Ni film 13 is immersed in the KOH solution 72. The Ni film 13 is connected to a positive electrode of a DC power supply 73. A negative electrode of the DC power supply 73 is connected to an electrode terminal 74 such as a platinum electrode terminal in the KOH solution 72. Hence, the potential of the positive electrode of the DC power supply 73 is applied to the sacrificial layer 2 through the Ni film 13 and the Ti film 11. The alkaline KOH solution 72, which is an electrolytic solution, has a concentration of, for example, about 0.0001 mol/L to about 10 mol/L and preferably 0.001 mol/L to 10 mol/L. The voltage of the DC power supply 73 is set to, for example, 0 V to +2 V. The sacrificial layer 2 is irradiated with light through the substrate 1. As the light with which the sacrificial layer 2 is irradiated, light having an energy which is higher than the band gap of a compound semiconductor, such as GaN, constituting the sacrificial layer 2 and which is lower than the band gap of a compound semiconductor, such as AlInN, constituting the etching stopper layer 3 is used. For example, in the case where an AlInN layer in which the proportion of Al is about 83 atomic percent with respect to the total amount of Al and In is used as the etching stopper layer 3, light having a wavelength of 253 nm to 365 nm is used. For example, a mercury lamp light source (i line) that emits light having a wavelength of 365 nm and an illuminance of about 100 mW/cm² may be used. Note that the wavelength of light that may be used varies depending on the Al content.

Figure 6:
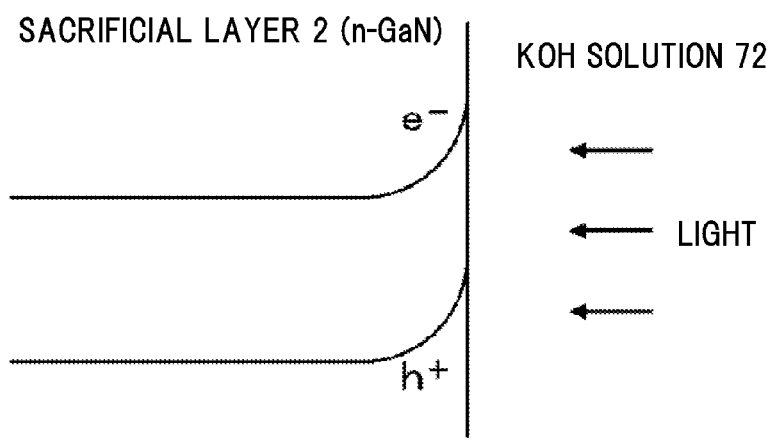
FIG. 6 illustrates reactions that occur during photoelectrochemical etching.

The application of the voltage and the light irradiation allow the sacrificial layer 2 (n-GaN layer) to be subjected to etching. That is, as illustrated in FIG. 6, when the sacrificial layer 2 (n-GaN layer) is irradiated with light, electrons ($e^-$) and holes ($h^+$) are produced. The contribution of the produced holes allows the etching to proceed. That is, reactions represented by formulae (1) and (2) occur at the sacrificial layer 2 (n-GaN layer) in contact with the KOH solution 72. The oxidation of Ga and dissolution of oxide allow the etching to proceed.

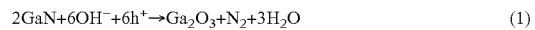

$$2GaN + 6OH^- + 6h^+ \rightarrow Ga_2O_3 + N_2 + 3H_2O \quad (1)$$

$$Ga_2O_3 + 6OH^- \rightarrow 2GaO_3^{3-} + 3H_2O \quad (2)$$

These reactions are promoted by the application of a voltage from the DC power supply 73. The reason for this is as follows: The sacrificial layer 2 is connected to the DC power supply 73 at a low resistance through the Ni film 13 and so forth. Thus, electrons are abstracted from the sacrificial layer 2 through the Ni film 13 and so forth. The reduction reaction of hydrogen occurs on the electrode terminal 74 serving as a counter electrode. Thereby, the recombination of electrons and holes in the sacrificial layer 2 is suppressed. Furthermore, in this embodiment, the KOH solution 72 is in contact with the sacrificial layer 2 through the penetrating grooves 10o. For these reasons, the sacrificial layer 2 is rapidly etched.

After the sacrificial layer 2 is subjected to etching, the etching stopper layer 3 comes into contact with the KOH solution 72. The etching stopper layer 3 is not easily etched. This is because the energy of the irradiation light is lower than that of the band gap of the etching stopper layer 3 (AlInN layer). That is, electrons and holes as illustrated in FIG. 6 are not produced in the etching stopper layer 3 under such conditions, so that the reactions represented by formulae (1) and (2) may not readily occur.

For example, in the case where the concentration of the KOH solution 72, which is an electrolytic solution, is about 2 mol/L and where a voltage from the DC power supply 73 is about +1 V, the etching rate of the sacrificial layer 2 composed of n-GaN is about 5 μm/min.

In this way, the photoelectrochemical etching is performed. The reason the concentration of the KOH solution 72 is preferably about 0.001 mol/L or more is that a concentration of less than about 0.001 mol/L may result in an extremely low etching rate. The reason the concentration of the KOH solution 72 is preferably about 10 mol/L or less is that a concentration exceeding about 10 mol/L may cause difficulty in controlling the concentration. Furthermore, a concentration exceeding about 10 mol/L may sometimes result in the absorption of light in the KOH solution 72, increasing the temperature.

Figure 7:
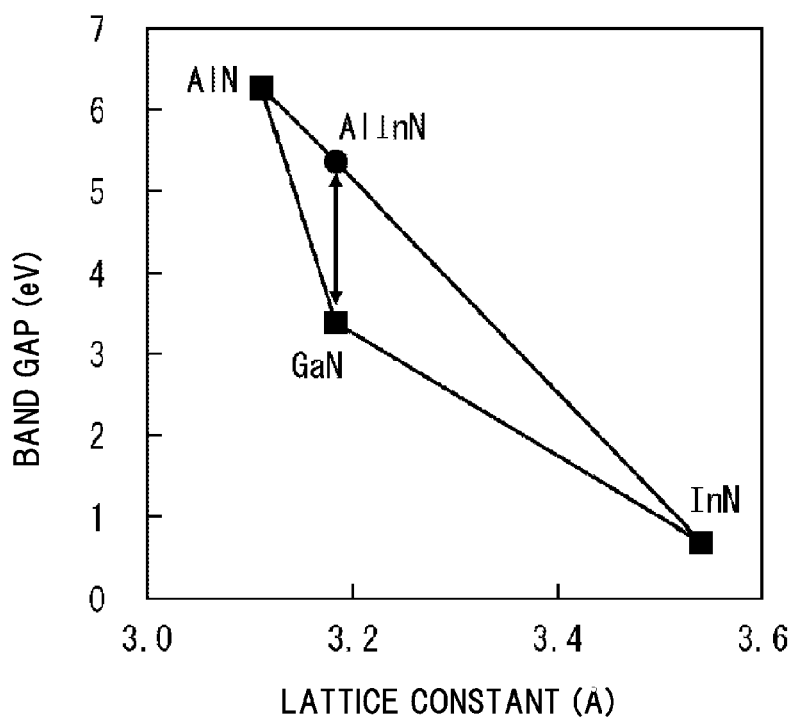
FIG. 7 is a graph illustrating the lattice constants and band gaps of various nitride semiconductors.

The lattice matching between the sacrificial layer 2 and the etching stopper layer 3 will be described below. FIG. 7 is a graph illustrating the lattice constants and band gaps of various nitride semiconductors. As illustrated in FIG. 7, although the band gap and the lattice constant of AlInN vary depending on the Al content, an Al content within an appropriate range, for example, an Al content of 73 atomic percent or more and less than 100 atomic percent, results in a large difference in band gap between AlInN and GaN and results in a small difference in lattice constant between AlInN and GaN. Thus, in the case of using GaN as the sacrificial layer 2 and AlInN as the etching stopper layer 3, it is possible to form the etching stopper layer 3 having a large thickness. Furthermore, it is also possible to reliably remove the sacrificial layer 2 while leaving the etching stopper layer 3 during the photoelectrochemical etching. In particular, in the case where the proportion of Al is about 83 atomic percent with respect to the total amount of Al and In, the lattice constant of AlInN is matched to that of GaN, so that the etching stopper layer 3 having a large thickness is easily formed. Furthermore, an intermediate product produced during the etching of InN contained in AlInN is not easily dissolved in the KOH solution. Thus, AlInN is not easily etched. This facilitates the removal of the sacrificial layer 2 while leaving the etching stopper layer 3.

In the case where a GaN layer is formed as the sacrificial layer 2 and where an AlGaN layer is formed as the etching stopper layer 3, as illustrated in FIG. 7, in order to achieve satisfactory lattice matching, a reduction in difference in lattice constant therebetween, i.e., a reduction in Al content, reduces the difference in band gap. In order to reliably leave the etching stopper layer 3 during the photoelectrochemical etching, an increase in difference in band gap, i.e., an increase in Al content, increases the difference in lattice constant. Thus, in the case where the GaN layer is formed as the sacrificial layer 2 and where the AlGaN layer is formed as the etching stopper layer 3, it may be difficult to provide the effect of this embodiment.

In the case where an InGaN layer is formed as the sacrificial layer 2 and where a GaN layer is formed as the etching stopper layer 3, in order to achieve satisfactory lattice matching, a reduction in difference in lattice constant therebetween, i.e., a reduction in In content, causes a reduction in difference in bad gap. In order to reliably leave the etching stopper layer 3 during the photoelectrochemical etching, an increase in difference in band gap, i.e., an increase in In content, increases the difference in lattice constant. Furthermore, an intermediate product produced during the etching of InN is not easily dissolved in the KOH solution. It is thus difficult to etch the sacrificial layer 2. Hence, in the case where the InGaN layer is formed as the sacrificial layer 2 and where the GaN layer is formed as the etching stopper layer 3, it may be difficult to provide the effect of this embodiment.

According to the first embodiment, it is possible to appropriately remove the substrate 1 while layers (e.g., the electron transport layer 4 and the electron supply layer 5) associated with the operations of the HEMTs are protected by forming the etching stopper layer 3 having a large thickness. It is thus possible to achieve high heat-dissipating properties using the heat-dissipating substrate 15 while each of the electron transport layer 4 and the electron supply layer 5 has satisfactory crystallinity.

Note that an undoped GaN layer (i-GaN layer) may be formed as the sacrificial layer 2. However, the use of an n-GaN layer results in a higher etching rate during photoelectrochemical etching. The reason for this is that in the case where the sacrificial layer 2 has an n-type conductivity, the valence band of the compound semiconductor (GaN) constituting the sacrificial layer 2 bends upward at the interfaces between the sacrificial layer 2 and the electrolytic solution (the KOH solution 72), so that holes that contribute to the etching reaction are easily accumulated at the interfaces.

Second Embodiment

A second embodiment will be described below. In the second embodiment, a compound semiconductor device having the layout illustrated in FIGS. 1 and 2 is also manufactured.

Figure 8A:
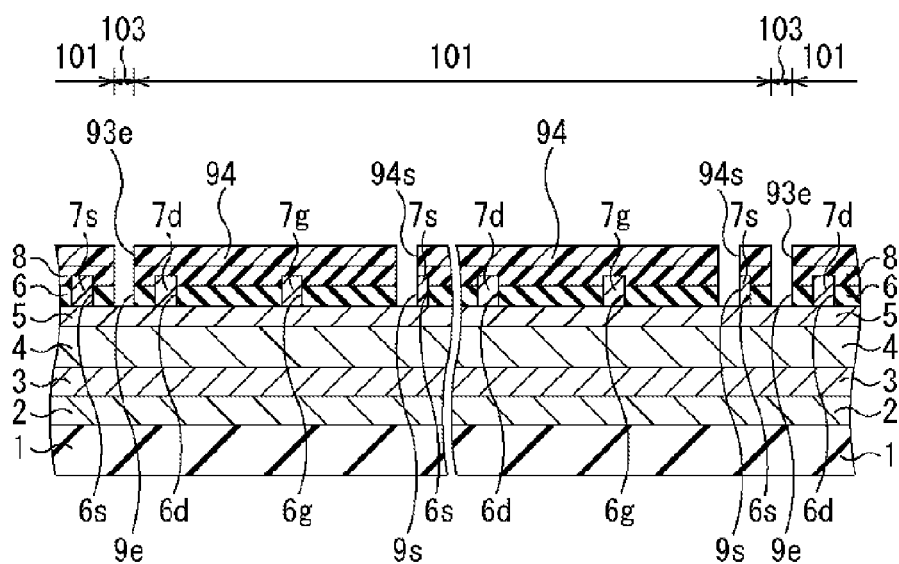
FIGS. 8A to 8E are cross-sectional views taken along line I-I in FIG. 2 and illustrate a method of manufacturing a compound semiconductor device according to a second embodiment.

The steps up to the formation of the passivation film 8 are performed in substantially the same way as in the first embodiment (see FIG. 3G). As illustrated in FIG. 8A, a resist pattern 94 is formed over the passivation film 8, the resist pattern 94 having the openings 93o formed in the penetrating groove regions 102 (see FIG. 4A), the openings 93e formed in the electrode groove regions 103, and openings 94s that overlap the source electrodes 7s in plan view. The passivation films 8 and 6 and the source electrodes 7s are partially subjected to dry etching with the resist pattern 94 as a mask. Thereby, the grooves 9o are formed in the penetrating groove regions 102 of the passivation films 8 and 6 (see FIG. 4A), and the grooves 9e are formed in the electrode groove regions 103. Grooves 9s are also formed, each of the grooves 9s allowing a side face of a corresponding one of the source electrodes 7s to be partially exposed.

Figure 8B:
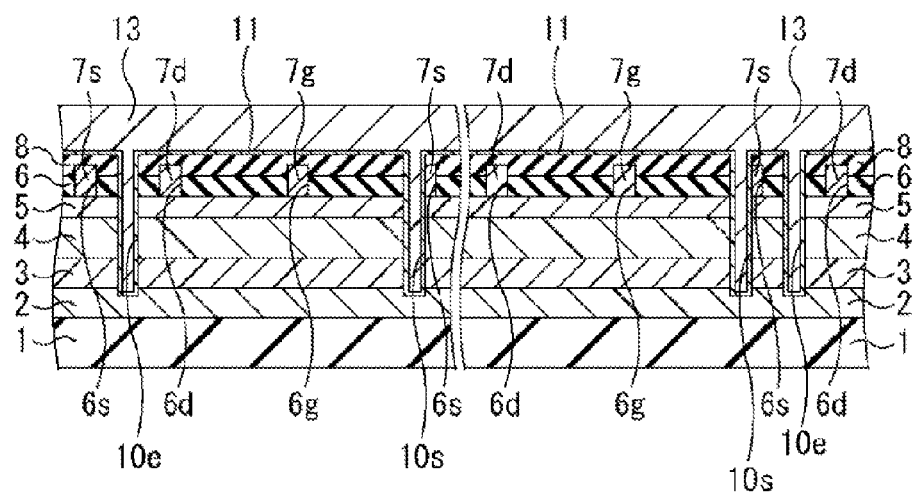

The electron supply layer 5, the electron transport layer 4, and the etching stopper layer 3 are subjected to dry etching with the resist pattern 94 as a mask. Thereby, as illustrated in FIG. 8B, the penetrating grooves 10o configured to allow the sacrificial layer 2 to be exposed therethrough are formed in the penetrating groove regions 102 of the electron supply layer 5, the electron transport layer 4, and the etching stopper layer 3 (see FIG. 4B), and the electrode grooves 10e configured to allow the sacrificial layer 2 to be exposed are formed in the electrode groove regions 103. Furthermore, the grooves 9s are allowed to extend, thereby forming source grooves 10s that allow the sacrificial layer 2 to be exposed. Then the Ti film 11 and the Ni film 13 are formed in substantially the same way as in the first embodiment. At this time, the Ti film 11 and the Ni film 13 are formed also in the source grooves 10s. Thus, the source electrodes 7s are electrically connected to the Ni film 13.

Figure 8C:
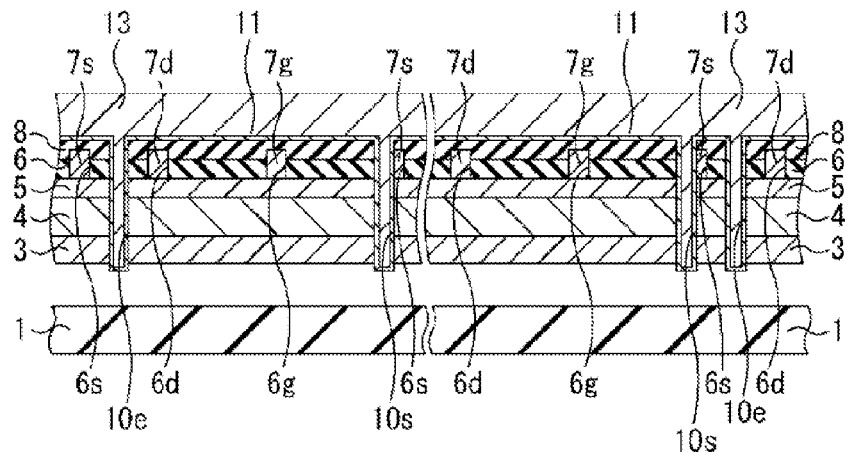

As illustrated in FIG. 8C, the sacrificial layer 2 is removed by photoelectrochemical etching in substantially the same way as in the first embodiment, thereby separating the substrate 1 from the etching stopper layer 3.

Figure 8D:
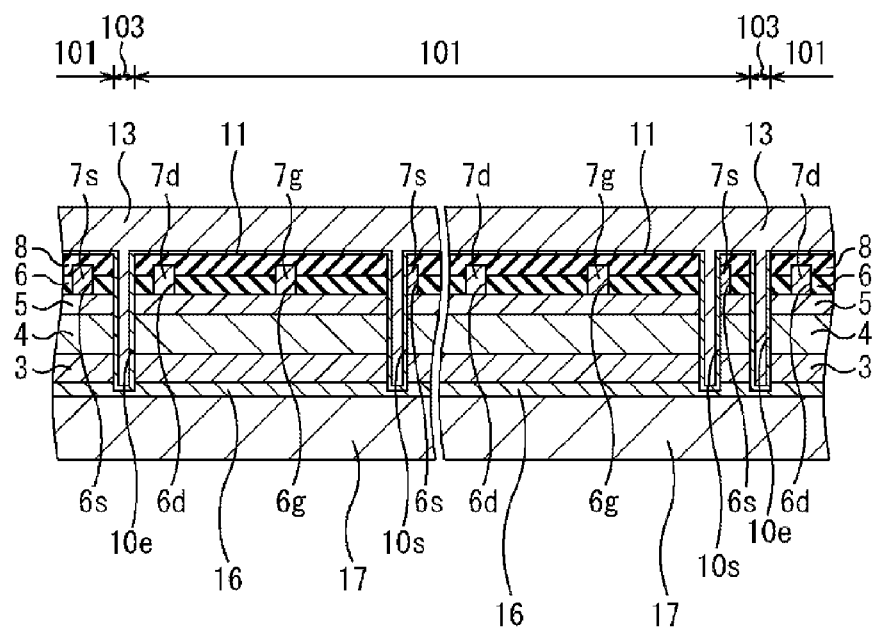

As illustrated in FIG. 8D, for example, a conductive substrate 17 is bonded to the etching stopper layer 3 with a conductive brazing material 16. That is, the etching stopper layer 3 and the conductive substrate 17 are bonded to each other with the brazing material 16. The conductive substrate 17 preferably has a conductivity of, for example, 30 W/(m·K) or more. As the conductive substrate 17, for example, a low-resistance Si substrate may be used. The conductive substrate 17 has a thickness of, for example, about 100 µm to about 1 mm. As the brazing material 16, for example, Ag paste may be used.

Figure 8E:
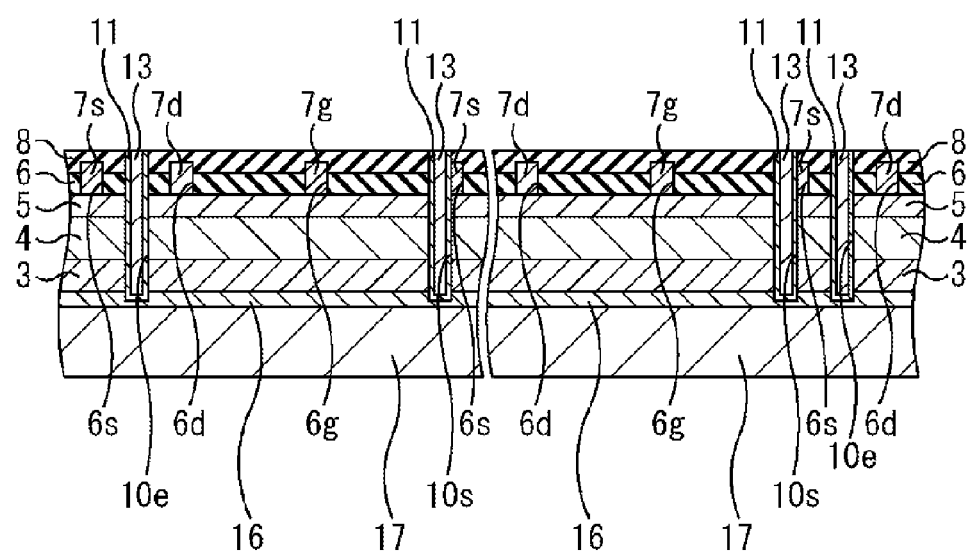

As illustrated in FIG. 8E, the Ni film 13 and the Ti film 11 are removed in substantially the same way as in the first embodiment. Wiring for the gate electrodes 7g, wiring for the source electrodes 7s, wiring for the drain electrodes 7d, and so forth are formed. Thereby, a compound semiconductor device is produced.

In this embodiment, the source electrodes 7s are electrically connected to the conductive substrate 17 through the Ni film 13 and so forth. It is thus possible to apply a potential to the source electrodes 7s from the conductive substrate 17. Hence, the wiring for the source electrodes 7s need not be arranged in the vicinity of the wiring for the drain electrodes 7d. This may make it possible to provide a smaller chip area in each of the transistor regions 101 than that in the first embodiment. Furthermore, the entirety of the conductive substrate 17 is connected to the source electrodes 7s. Thus, the withstand voltage may be improved by a backside field plate effect.

Third Embodiment

Figure 9:
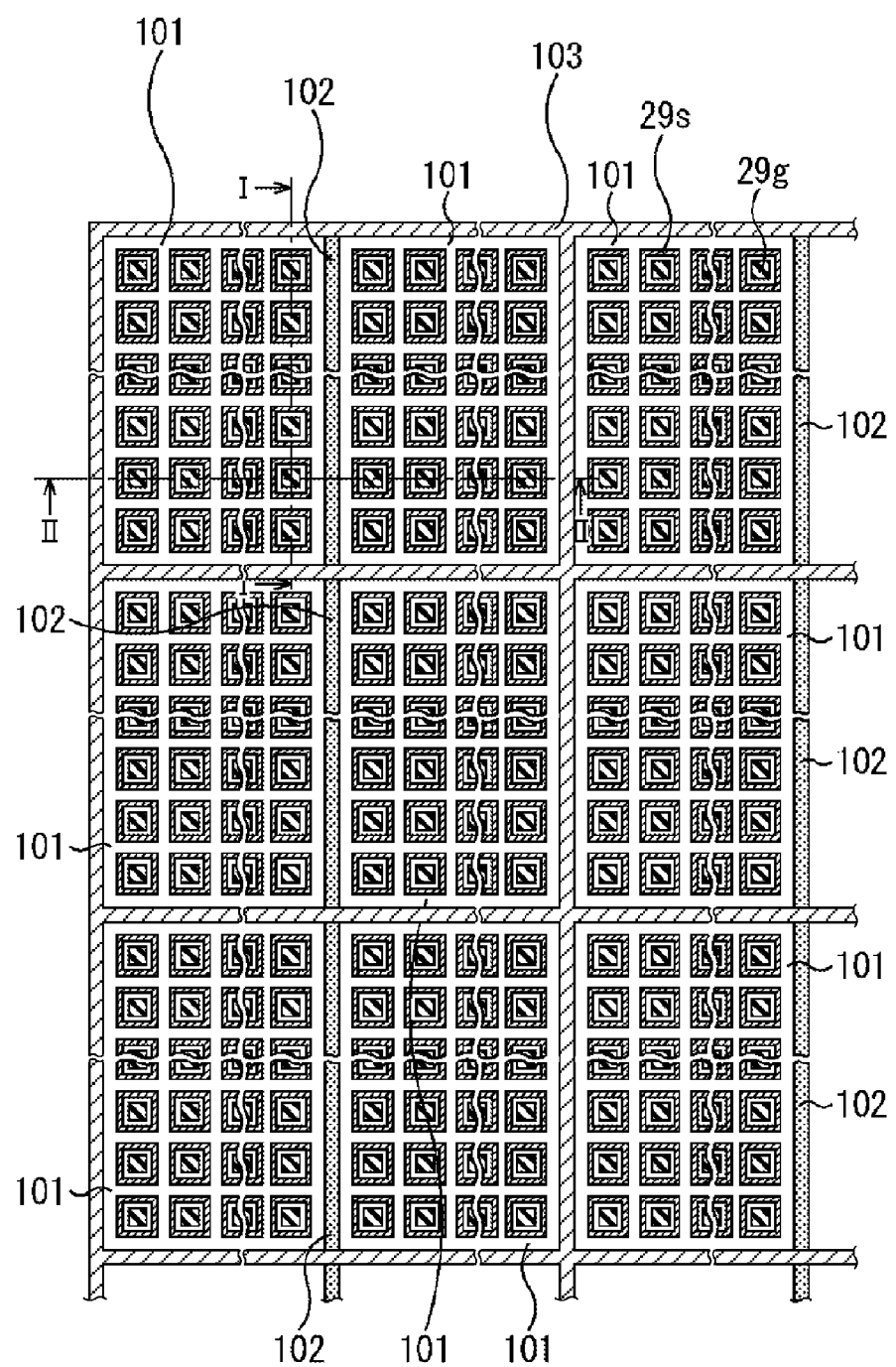
FIG. 9 illustrates the layout of electrodes of vertical HEMTs on the front surface side.

In the first and second embodiments, the lateral HEMTs are formed in the transistor regions 101. In a third embodiment, vertical HEMTs are formed in the transistor regions 101. FIG. 9 illustrates the layout of electrodes of vertical HEMTs on the front surface side. As illustrated in FIG. 9, gate electrodes 29g and source electrodes 29s are formed in each of the transistor regions 101. Drain electrodes are formed over the back surface side. For example, each of the source electrodes 29s is arranged so as to surround a corresponding one of the gate electrodes 29g in plan view. The gate electrodes 29g of the plural vertical HEMTs provided in one transistor region 101 are commonly connected to each other, and the source electrodes 29s are also commonly connected to each other. The drain electrodes are shared by the plural vertical HEMTs.

Figure 10A:
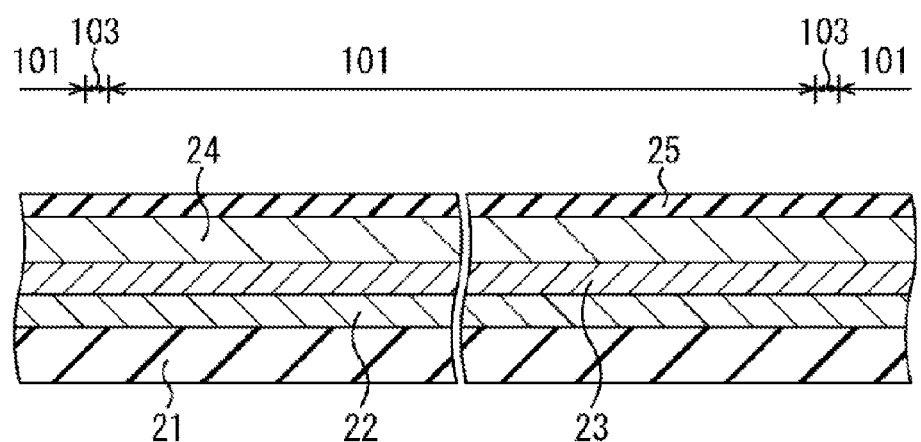
FIGS. 10A to 10P are cross-sectional views taken along line I-I in FIG. 9 and illustrate a method of manufacturing a compound semiconductor device according to a third embodiment.

As illustrated in FIG. 10A, a sacrificial layer 22, an etching stopper layer 23, an electron transport layer 24, and an AlN layer 25 are formed over a substrate 21. For the formation of the sacrificial layer 22, the etching stopper layer 23, the electron transport layer 24, and the AlN layer 25, crystal growth is performed by, for example, MOCVD. As the substrate 21, for example, a transparent sapphire substrate having polished front and back surfaces is used. As the sacrificial layer 22, for example, a layer substantially the same as the sacrificial layer 2 in the first embodiment is formed. As the etching stopper layer 23, for example, a layer substantially the same as the etching stopper layer 3 in the first embodiment is formed. As the electron transport layer 24, for example, an n-type GaN layer (n-GaN layer) which has a thickness of 0.1 µm to 20 µm (e.g., about 1 µm) and which is doped with, for example, Si serving as an impurity at a concentration of about $5 \times 10^{18}$ cm$^{-3}$ is formed. The AlN layer 25 has a thickness of, for example, 10 nm to 1 µm (e.g., about 100 nm).

Figure 10B:
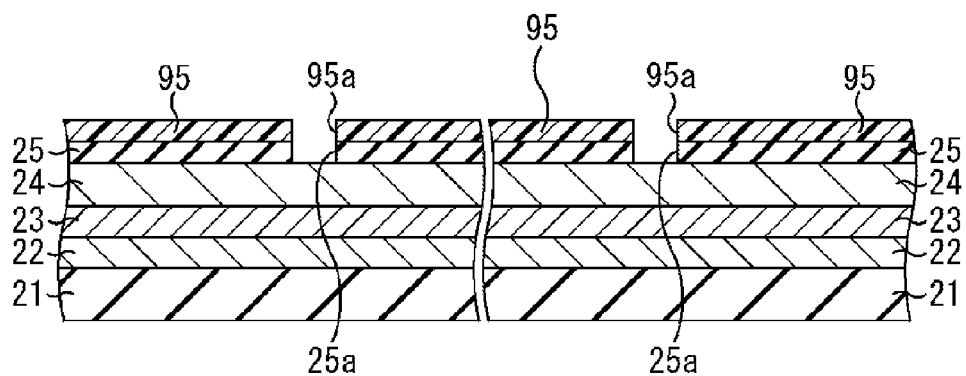

As illustrated in FIG. 10B, a resist pattern 95 is formed over the AlN layer 25, the resist pattern 95 having openings 95a configured to form holes in regions where current paths directly below the gate electrodes 29g will be formed. The AlN layer 25 is subjected to dry etching with the resist pattern 95 as a mask. For example, the dry etching is performed with $Cl_2$ gas at an antenna power of about 100 W, a bias power of about 10 W, and a pressure of about 1 Pa. Thereby, grooves 25a that are matched to the openings 95a are formed in the AlN layer 25.

Figure 10C:
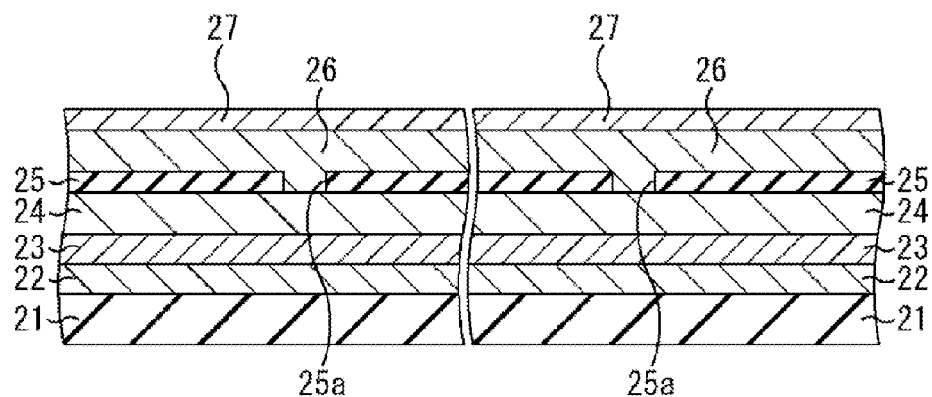

As illustrated in FIG. 10C, the resist pattern 95 is removed. An electron transport layer 26 is formed in the grooves 25a and over the AlN layer 25. An electron supply layer 27 is formed thereover. For the formation of the electron transport layer 26 and the electron supply layer 27, crystal growth is also performed by, for example, MOCVD. As the electron transport layer 26, for example, an n-type GaN layer (n-GaN layer) which has a thickness of 0.1 µm to 20 µm (e.g., about 2 µm) and which is doped with, for example, Si serving as an impurity at a concentration of about $5 \times 10^{18}$ cm$^{-3}$ is formed. As the electron supply layer 27, for example, an n-type AlGaN layer (n-AlGaN layer) which has a thickness of 2 nm to 50 nm (e.g., about 30 nm) and which is doped with, for example, Si serving as an impurity at a concentration of about $5 \times 10^{18}$ cm$^{-3}$ is formed.

Figure 10D:
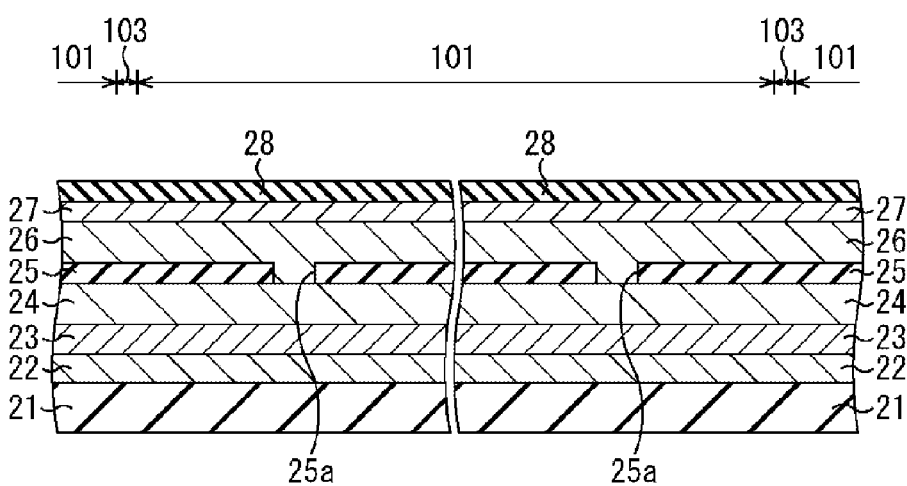

As illustrated in FIG. 10D, a passivation film 28 is formed over the electron supply layer 27. As the passivation film 28, for example, a silicon nitride film having a thickness of 5 nm to 500 nm (e.g., about 100 nm) is formed by CVD.

Figure 10E:
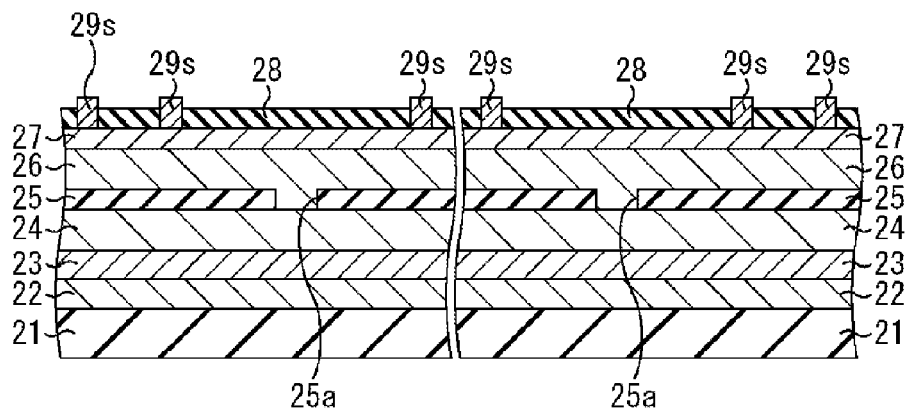

As illustrated in FIG. 10E, openings are formed in regions of the passivation film 28 where the source electrodes 29s will be formed. The source electrodes 29s are formed in the openings by, for example, a lift-off method. As the source electrodes 29s, for example, a laminate including a Ti film and an Al film provided thereover is formed in substantially the same way as in the first embodiment, the Ti film having a thickness of about 30 nm, and the Al film having a thickness of about 100 nm. For example, heat treatment is performed in a nitrogen atmosphere at 400° C. to 1000° C. (e.g., about 600° C.). Thereby, ohmic properties of the source electrodes 29s are established.

Figure 10F:
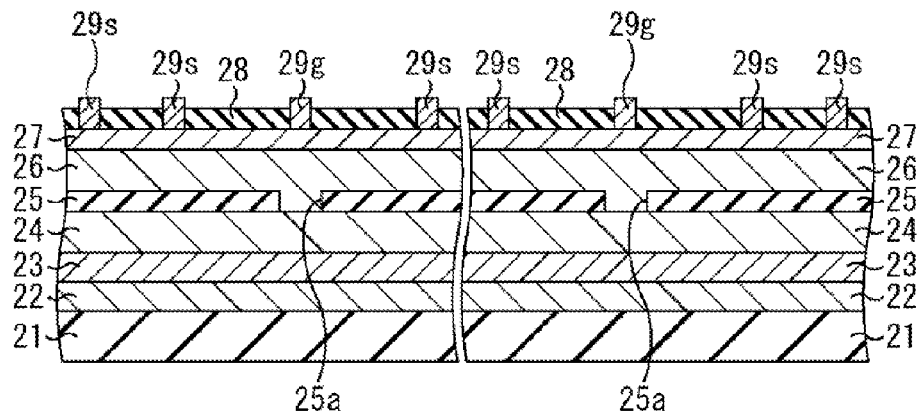

As illustrated in FIG. 10F, openings are formed in regions of the passivation film 28 where the gate electrodes 29g will be formed. The gate electrodes 29g are formed in the openings by, for example, the lift-off method. As the gate electrodes 29g, for example, a laminate including a Ni film and a Au film provided thereover is formed in substantially the same way as in the first embodiment, the Ni film having a thickness of about 10 nm, and the Au film having a thickness of about 200 nm.

Figure 10G:
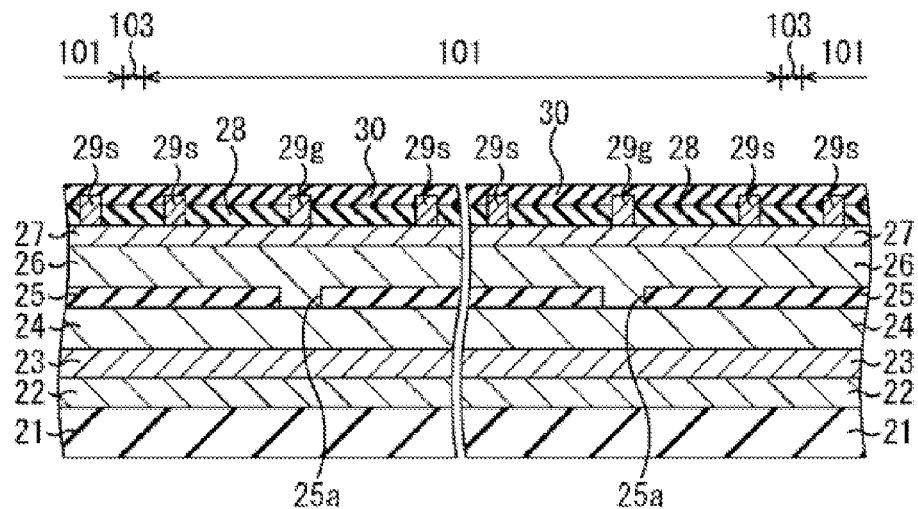

As illustrated in FIG. 10G, a passivation film 30 is formed over the passivation film 28 so as to cover the gate electrodes 29g and the source electrodes 29s. As the passivation film 30, for example, a silicon nitride film having a thickness of 10 nm to 1000 nm (e.g., about 500 nm) is formed by CVD.

Figure 10H:
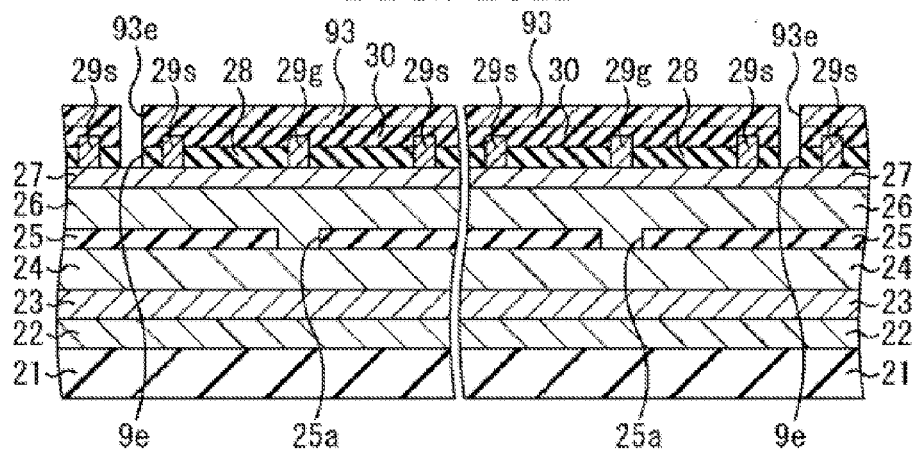
Figure 11A:
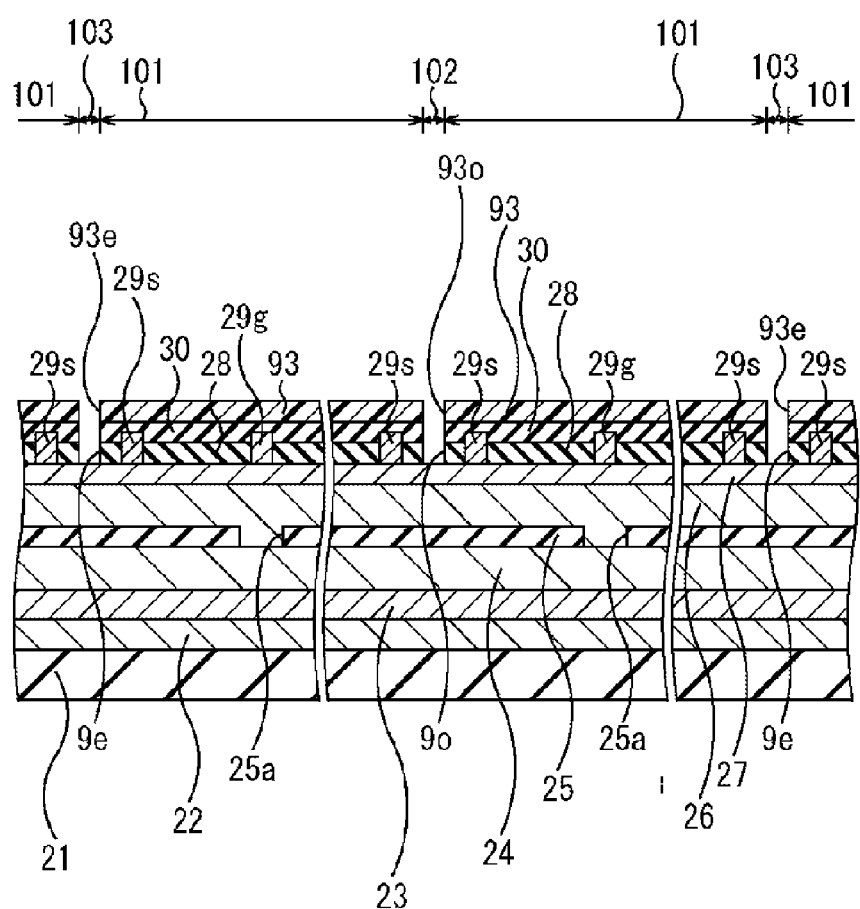
FIGS. 11A to 11I are cross-sectional views taken along line II-II in FIG. 9 and illustrate the method of manufacturing a compound semiconductor device according to the third embodiment.

As illustrated in FIGS. 10H and 11A, the resist pattern 93 is formed over the passivation film 30 in the same way as in the first embodiment. The passivation films 30 and 28 are subjected to dry etching with the resist pattern 93 as a mask. Thereby, the grooves 9o are formed in the penetrating groove regions 102 of the passivation films 30 and 28, and the grooves 9e are formed in the electrode groove regions 103.

Figure 10I:
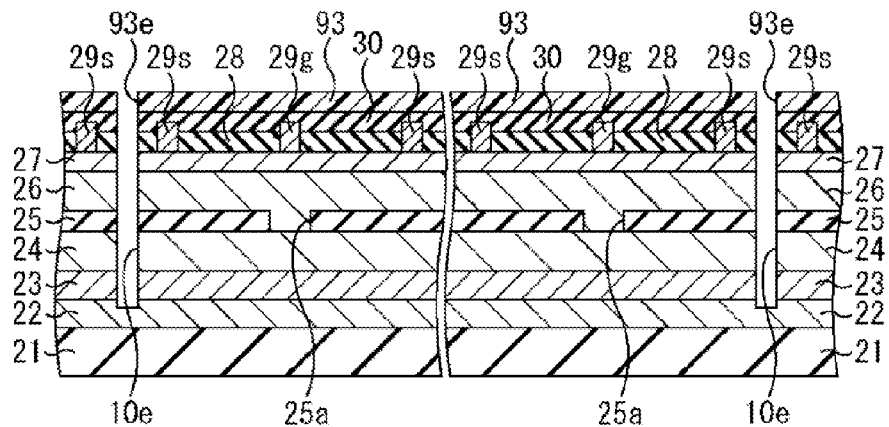
Figure 11B:
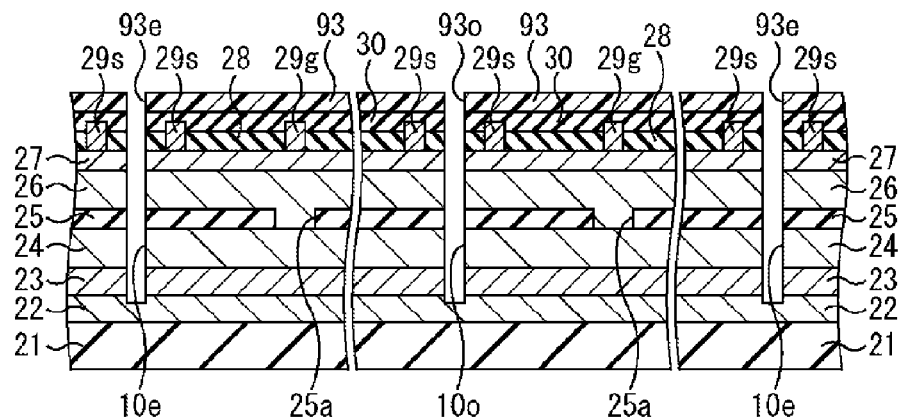

The electron supply layer 27, the electron transport layer 26, the AlN layer 25, the electron transport layer 24, and the etching stopper layer 23 are subjected to dry etching with the resist pattern 93 as a mask. Thereby, as illustrated in FIGS. 10I and 11B, the penetrating grooves 10o that allow the sacrificial layer 22 to be exposed are formed in the penetrating groove regions 102 of the electron supply layer 27, the electron transport layer 26, the AlN layer 25, the electron transport layer 24, and the etching stopper layer 23, and the electrode grooves 10e that allow the sacrificial layer 22 to be exposed are formed in the electrode groove regions 103.

Figure 10J:
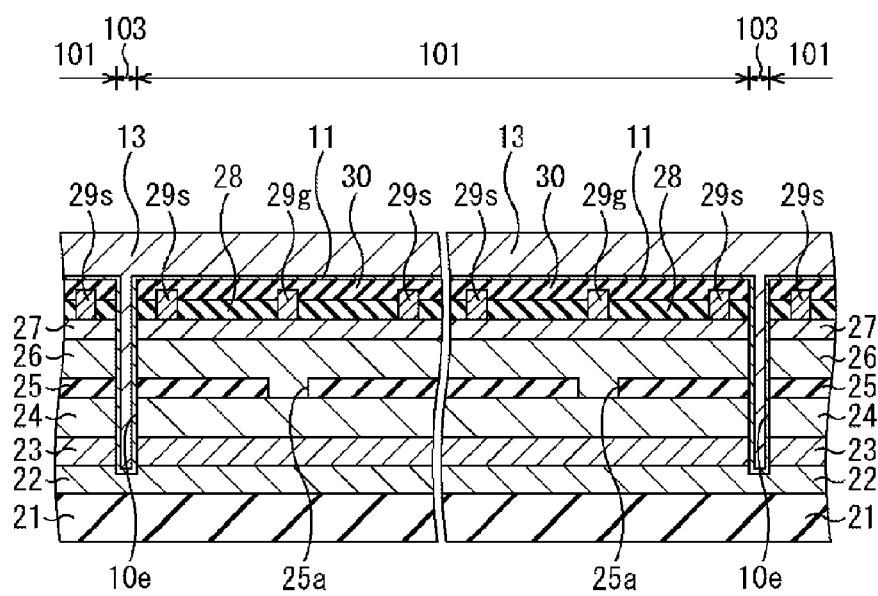
Figure 11C:
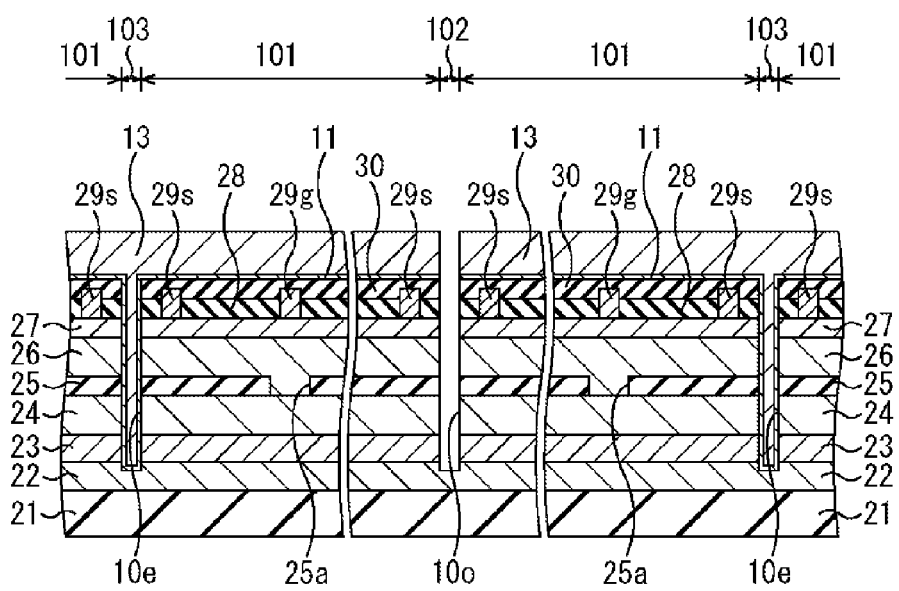

As illustrated in FIGS. 10J and 11C, for example, the Ti film 11 and the Ni film 13 are formed in substantially the same way as in the first embodiment.

Figure 10K:
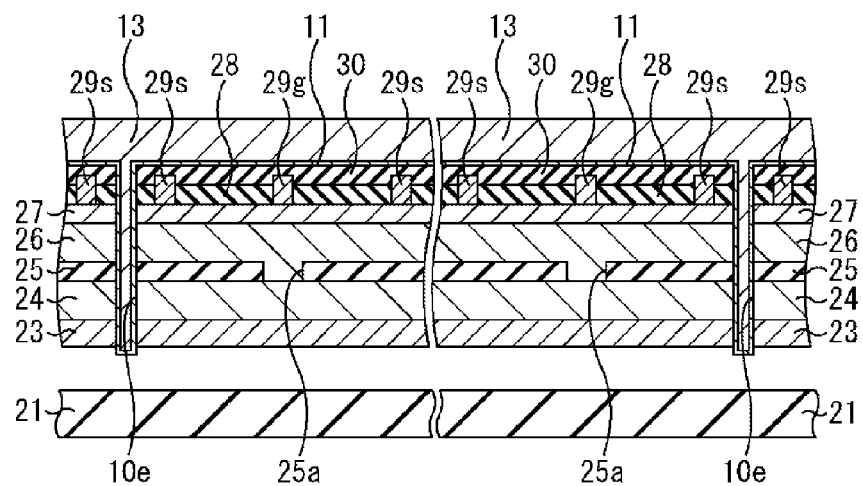
Figure 11D:
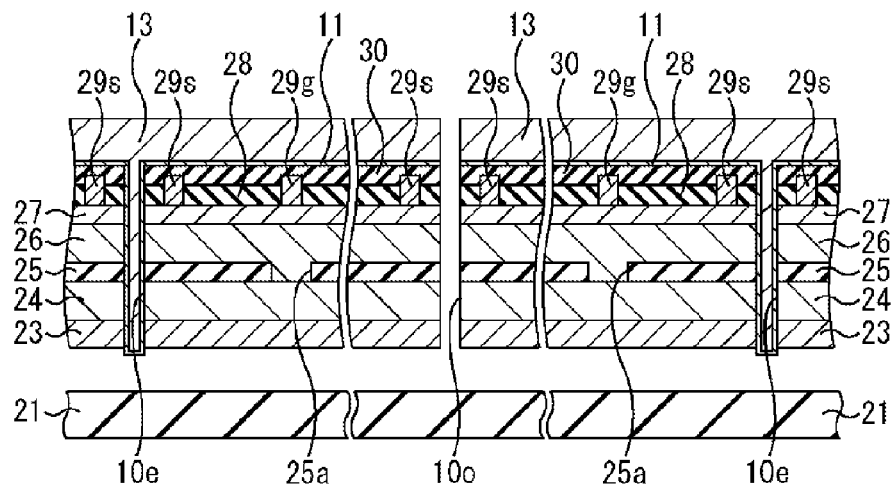

As illustrated in FIGS. 10K and 11D, the sacrificial layer 22 is removed by photoelectrochemical etching in substantially the same way as in the first embodiment, thereby separating the substrate 21 from the etching stopper layer 23.

Figure 10L:
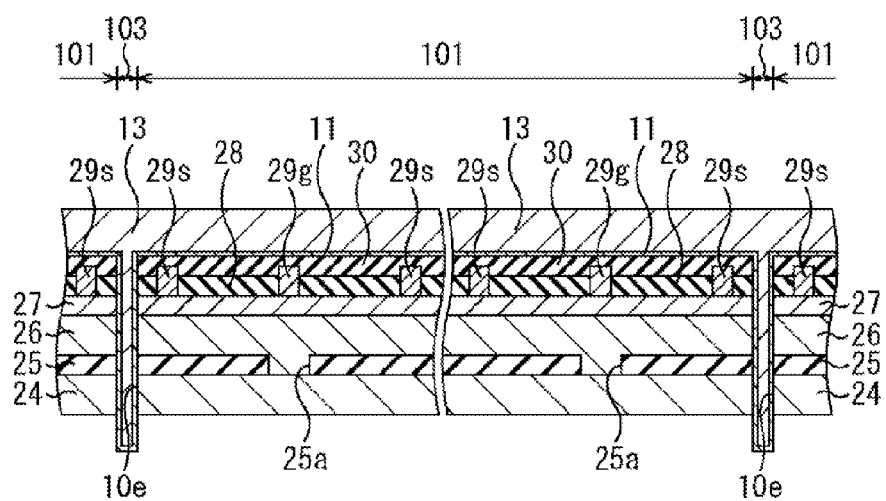
Figure 11E:
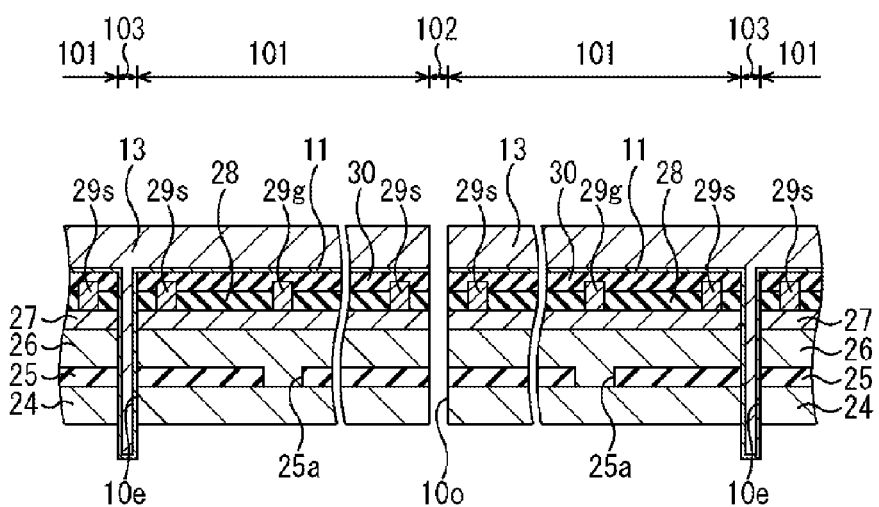

As illustrated in FIGS. 10L and 11E, the etching stopper layer 23 is removed. The etching stopper layer 23 is removed by, for example, dry etching.

Figure 10M:
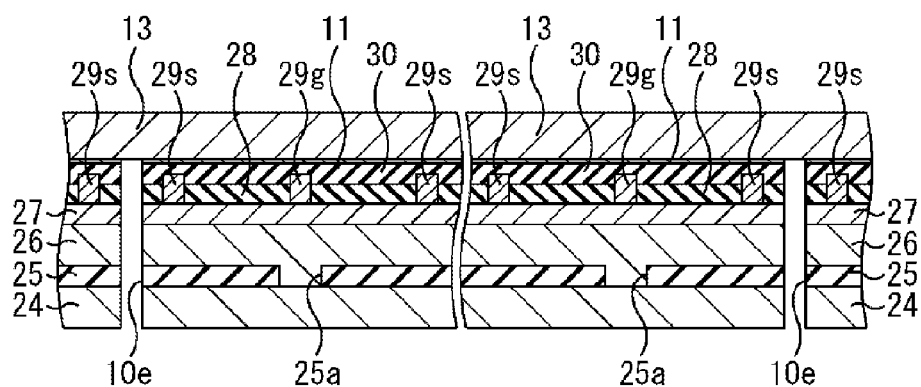
Figure 11F:
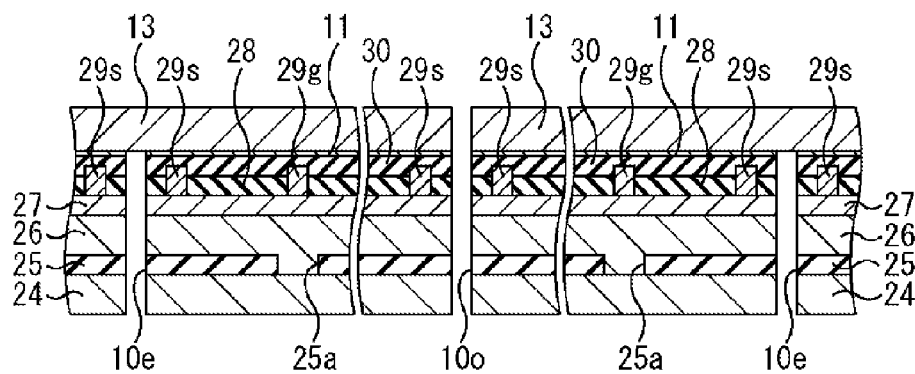

As illustrated in FIGS. 10M and 11F, the Ti film 11 and the Ni film 13 arranged in the electrode grooves 10e and protruding from the electrode grooves 10e are removed. The Ti film 11 and the Ni film 13 are removed by, for example, ion milling.

Figure 10N:
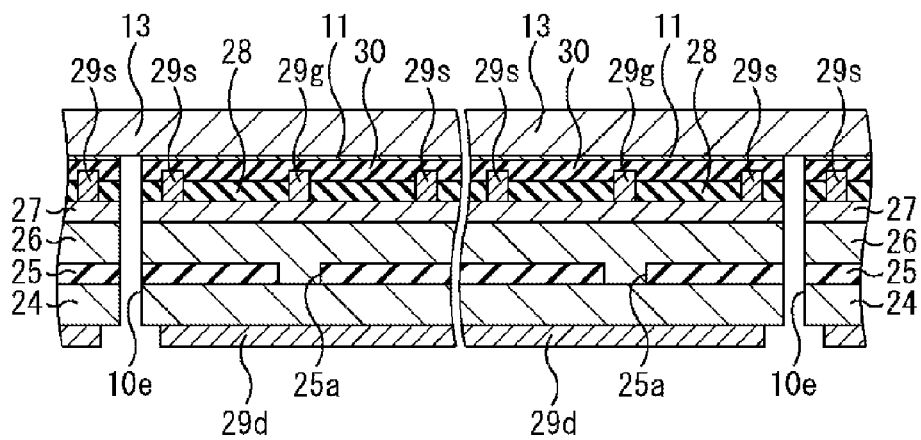
Figure 11G:
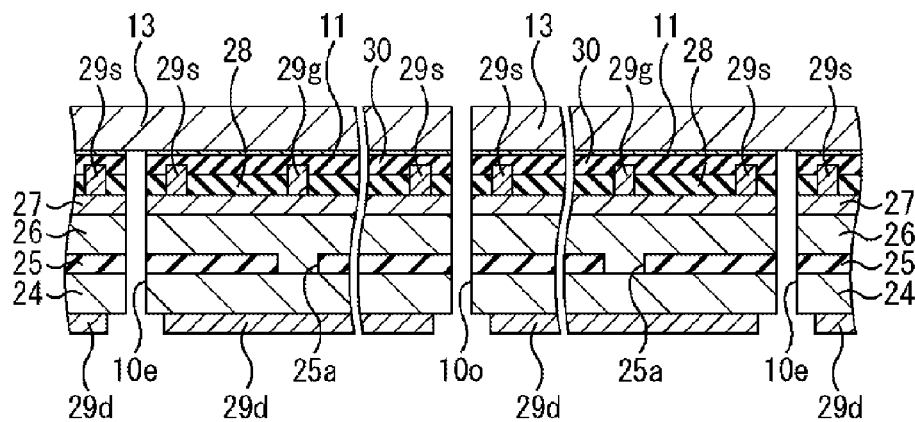

As illustrated in FIGS. 10N and 11G, drain electrodes 29d are formed over the back surface of the electron transport layer 24. In the formation of the drain electrodes 29d, preferably, a resist film is formed in the penetrating grooves 10o and the electrode grooves 10e in order not to contaminate the penetrating grooves 10o and the electrode grooves 10e and then removed after the formation of the drain electrodes 29d. As the drain electrodes 29d, for example, a laminate including a Ti film and an Al film provided there over is formed, the Ti film having a thickness of about 30 nm, and the Al film having a thickness of about 100 nm. For example, heat treatment is performed in a nitrogen atmosphere at 400° C. to 1000° C. (e.g., about 600° C.). Thereby, ohmic properties of the drain electrodes 29d are established.

Figure 10O:
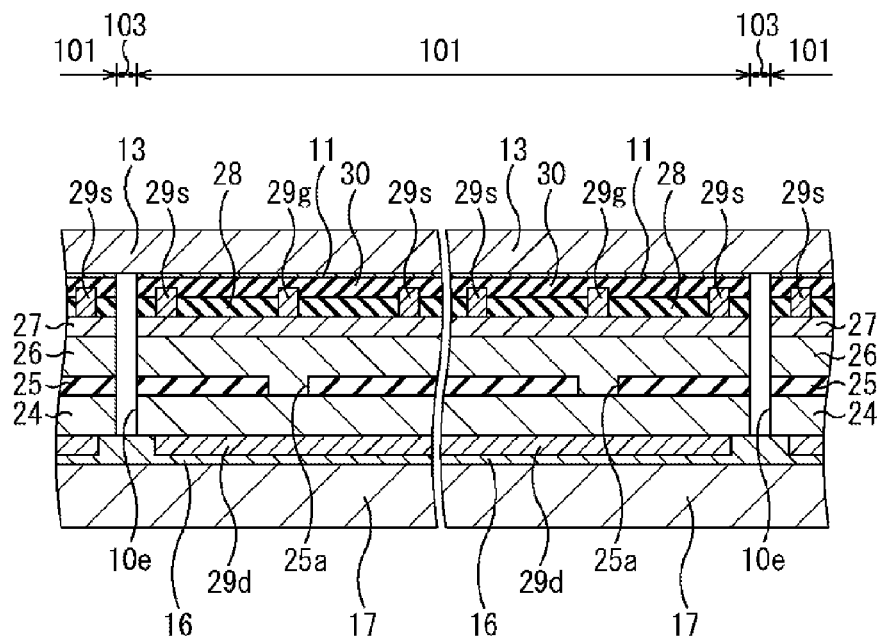
Figure 11H:
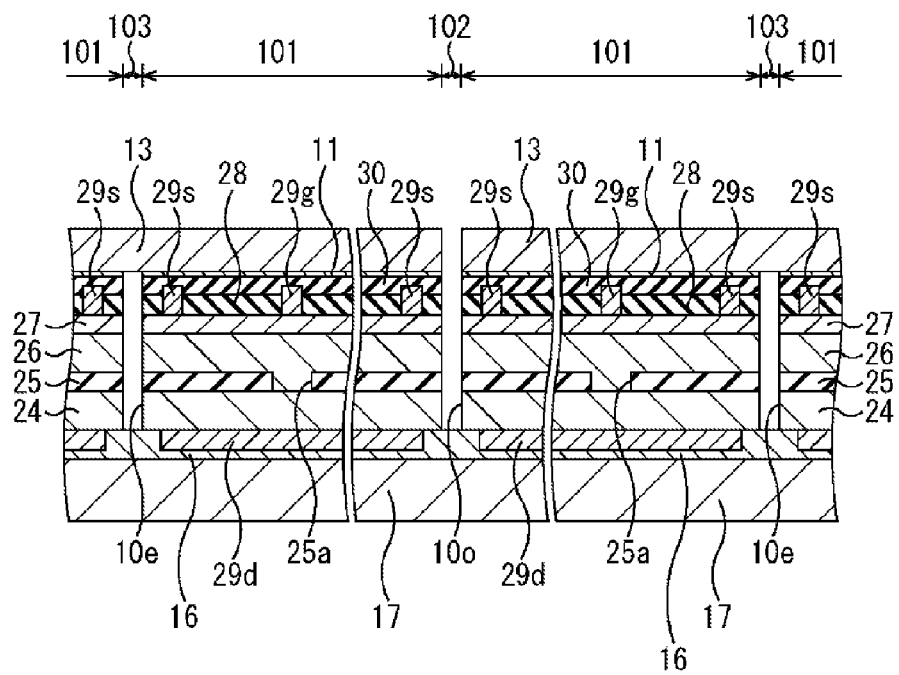

As illustrated in FIGS. 10O and 11H, for example, the conductive substrate 17 is bonded to the drain electrodes 29d and the electron transport layer 24 with the conductive brazing material 16. The conductive substrate 17 has a conductivity of, for example, 30 W/(m·K) or more. As the conductive substrate 17, for example, a low-resistance Si substrate may be used.

Figure 10P:
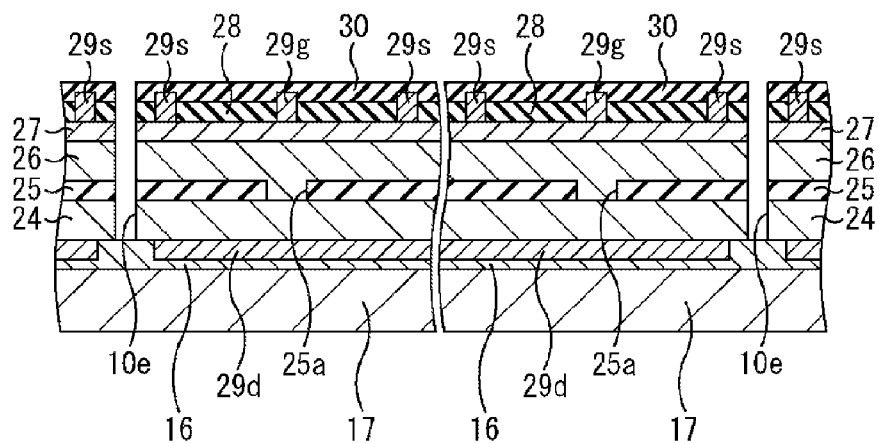
Figure 11I:
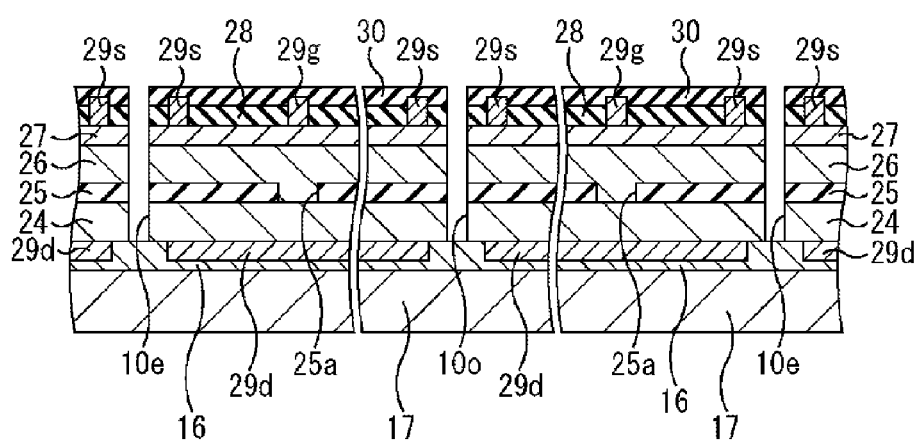

As illustrated in FIGS. 10P and 11I, the Ni film 13 and the Ti film 11 are removed. Wiring for the gate electrodes 29g, wiring for the source electrodes 29s, wiring for the drain electrodes 29d, and so forth are formed. Thereby, a compound semiconductor device is produced.

When the vertical HEMTs are used it may be possible to provide a smaller chip area in each of the transistor regions 101 than that in the first embodiment.

Fourth Embodiment

A fourth embodiment will be described.

Figure 12:
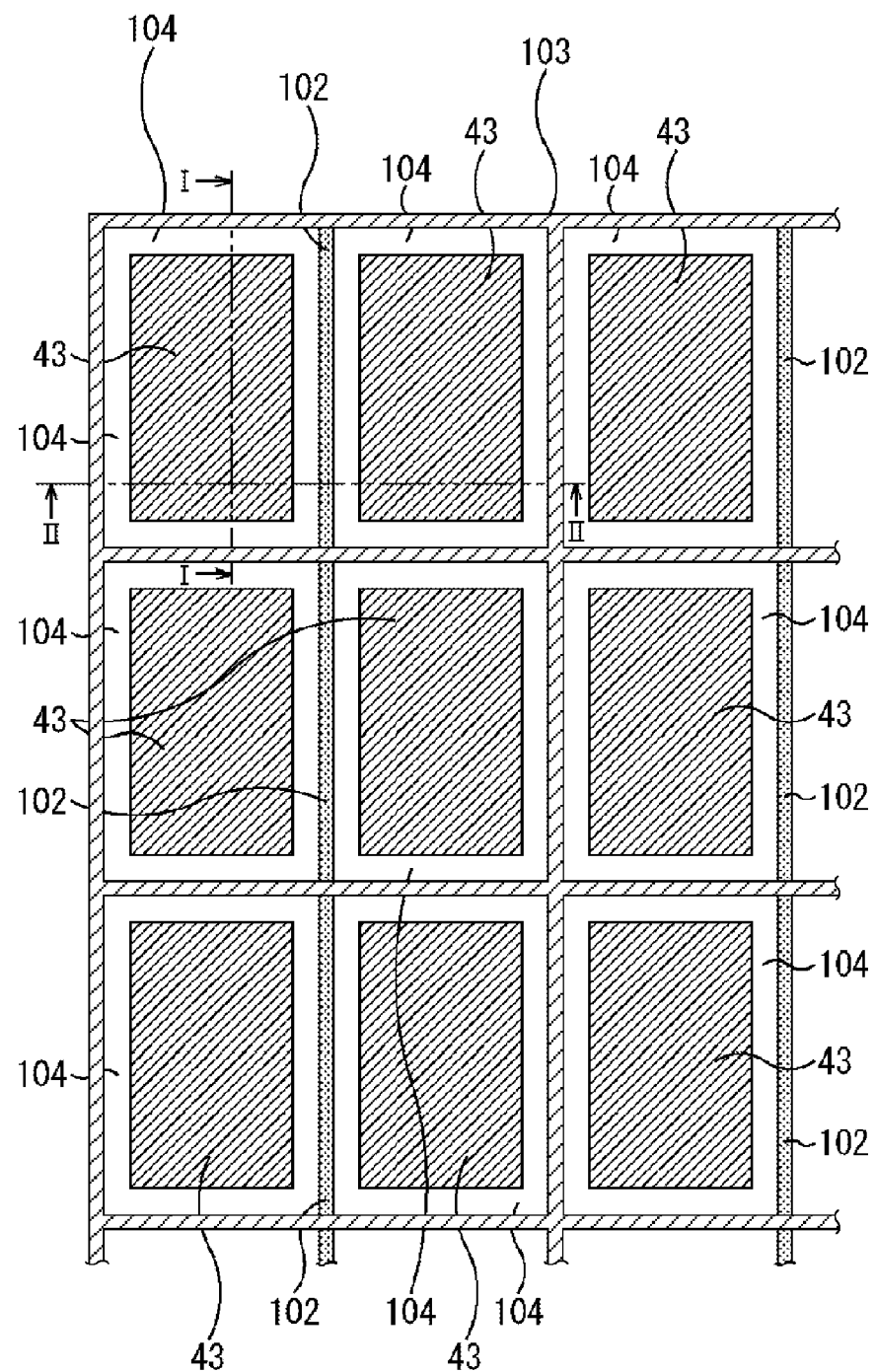
FIG. 12 illustrates a layout of a wafer according to a fourth embodiment and the layout of electrodes of semiconductor lasers on the front surface side.

In the fourth embodiment, as illustrated in FIG. 12, a substrate (wafer) is partitioned into laser regions 104, the penetrating groove regions 102, and the electrode groove regions 103. For example, layers configured to form a semiconductor laser are formed in the laser regions 104 as described below. The laser regions 104 are arranged at positions the same as those of the transistor regions 101 in the first to third embodiments. Furthermore, an electrode 43 connected to an n-type compound semiconductor layer is formed in each of the laser regions 104. Electrodes connected to a p-type compound semiconductor layer are formed over the back surface side.

Figure 13A:
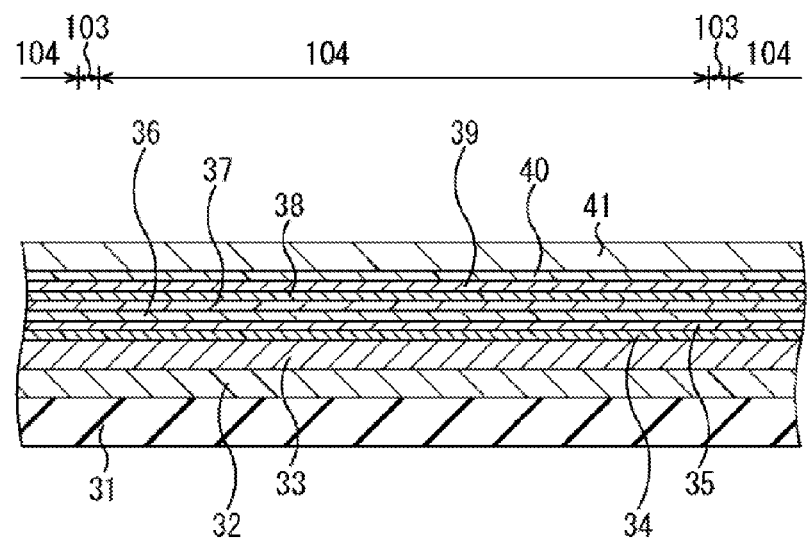
FIGS. 13A to 13I are cross-sectional views taken along line I-I in FIG. 12 and illustrate a method of manufacturing a compound semiconductor device according to a fourth embodiment.

As illustrated in FIG. 13A, for example, a sacrificial layer 32, an etching stopper layer 33, a p-type GaN layer (p-GaN layer) 34, a p-type superlattice layer 35, a p-type light guide layer 36, a p-type AlGaN layer (p-AlGaN layer) 37, an active layer 38, an n-type light guide layer 39, an n-type superlattice layer 40, and an n-type GaN layer (n-GaN layer) 41 are formed over a substrate 31. In the formation of the sacrificial layer 32, the etching stopper layer 33, the p-GaN layer 34, the superlattice layer 35, the light guide layer 36, the p-AlGaN layer 37, the active layer 38, the light guide layer 39, the superlattice layer 40, and the n-GaN layer 41, crystal growth is performed by, for example, MOCVD. As the substrate 31, for example, a transparent sapphire substrate having polished front and back surfaces is used. As the sacrificial layer 32, for example, a layer substantially the same as the sacrificial layer 2 in the first embodiment is formed. As the etching stopper layer 33, for example, a layer substantially the same as the etching stopper layer 3 in the first embodiment is formed. The p-GaN layer 34 has a thickness of, for example, about 0.01 μm to about 0.5 μm (e.g., about 0.1 μm). As the superlattice layer 35, for example, a layer including AlGaN sublayers and GaN sublayers alternately stacked is formed. The superlattice layer 35 has a thickness of, for example, about 0.1 μm to about 1 μm (e.g., about 0.5 μm). As the light guide layer 36, for example, a GaN layer having a thickness of about 2 nm to about 50 nm (e.g., about 20 nm) is formed. The p-AlGaN layer 37 has a thickness of, for example, about 2 nm to about 50 nm (e.g., about 10 nm). As the active layer 38, for example, a multiple-quantum-well active layer including InGaN sublayers and GaN sublayers alternately stacked is formed. The active layer 38 has a thickness of, for example, about 5 nm to about 500 nm (e.g., about 50 nm). As the light guide layer 39, for example, a GaN layer having a thickness of about 0.01 μm to about 1 μm (e.g., about 0.1 μm) is formed. As the superlattice layer 40, for example, a layer including AlGaN sublayers and GaN sublayers alternately stacked is formed. The superlattice layer 40 has a thickness of, for example, about 0.01 μm to about 1 μm (e.g., about 0.1 μm). The n-GaN layer 41 has a thickness of, for example, about 0.5 μm to about 20 μm (e.g., about 8 μm).

Figure 13B:
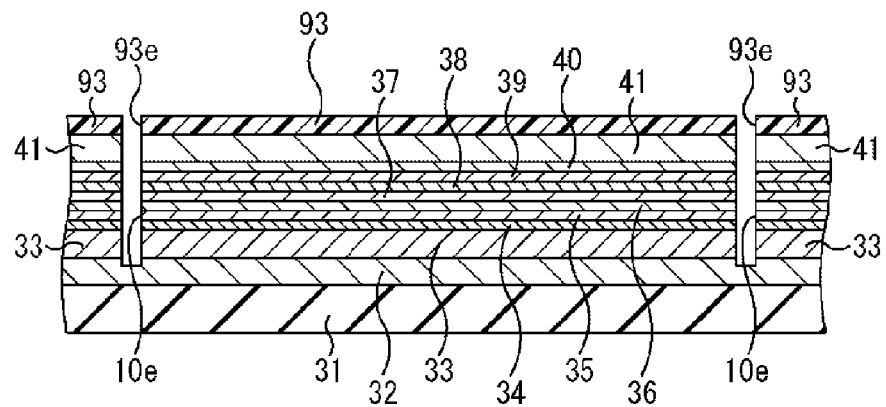
Figure 14A:
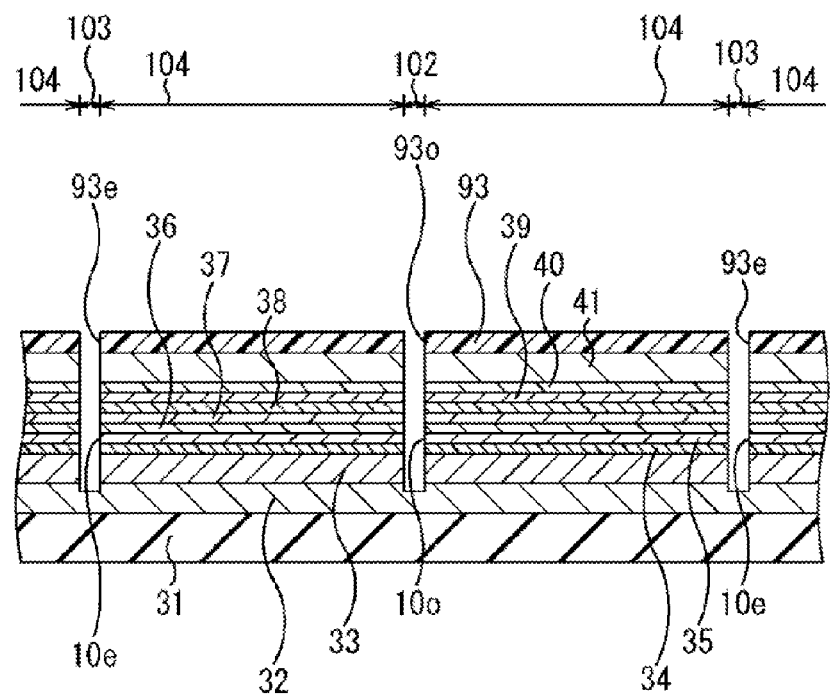
FIGS. 14A to 14H are cross-sectional views taken along line II-II in FIG. 12 and illustrate the method of manufacturing a compound semiconductor device according to the fourth embodiment.

As illustrated in FIGS. 13B and 14A, the resist pattern 93 is formed over the n-GaN layer 41 in the same way as in the first embodiment. The n-GaN layer 41, the superlattice layer 40, the light guide layer 39, the active layer 38, the p-AlGaN layer 37, the light guide layer 36, the superlattice layer 35, the p-GaN layer 34, and the etching stopper layer 33 are subjected to dry etching with the resist pattern 93 as a mask. Thereby, the penetrating grooves 10o that allow the sacrificial layer 32 to be exposed are formed in the penetrating groove regions 102 of the n-GaN layer 41, the superlattice layer 40, the light guide layer 39, the active layer 38, the p-AlGaN layer 37, the light guide layer 36, the superlattice layer 35, the p-GaN layer 34, and the etching stopper layer 33. The electrode grooves 10e that allow the sacrificial layer 32 to be exposed are also formed in the electrode groove regions 103.

Figure 13C:
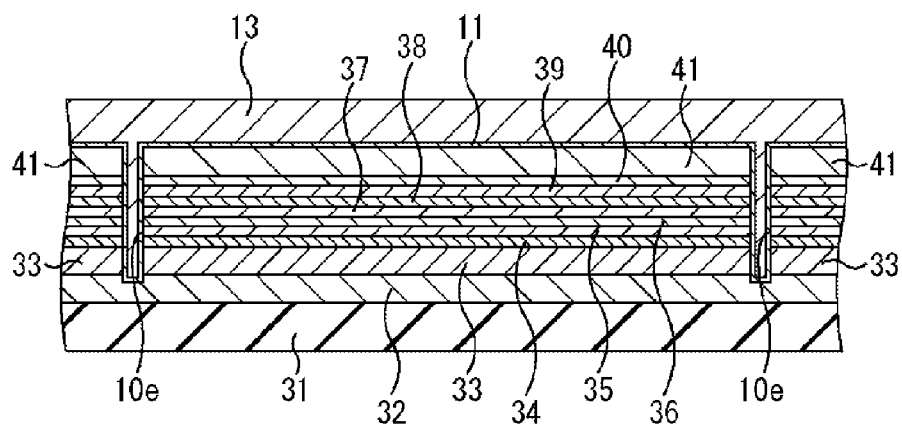
Figure 14B:
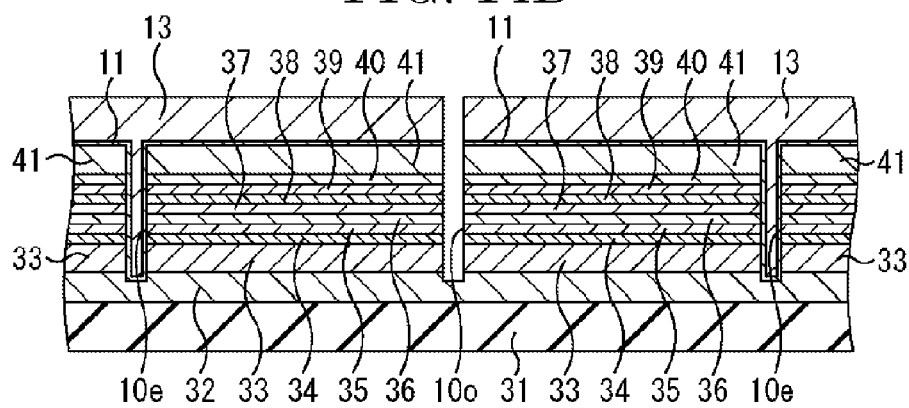

As illustrated in FIGS. 13C and 14B, for example, the Ti film 11 and the Ni film 13 are formed in substantially the same way as in the first embodiment.

Figure 13D:
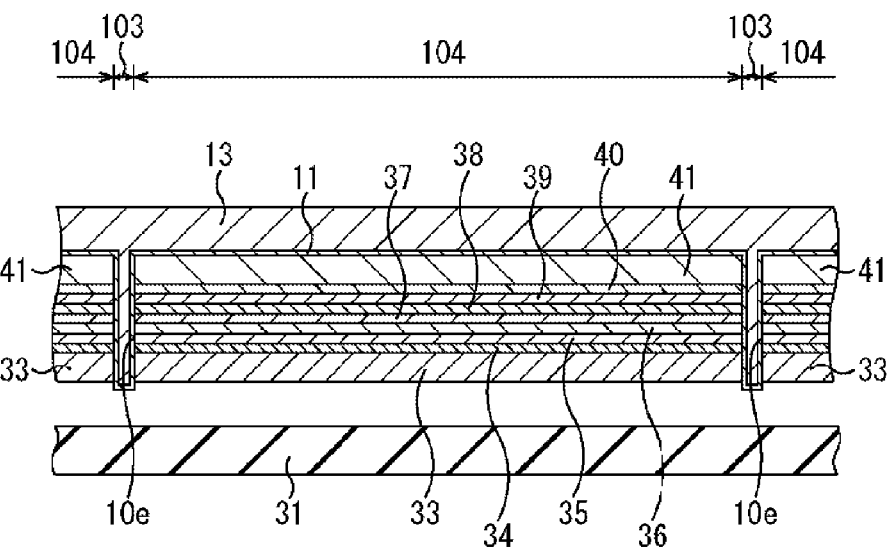
Figure 14C:
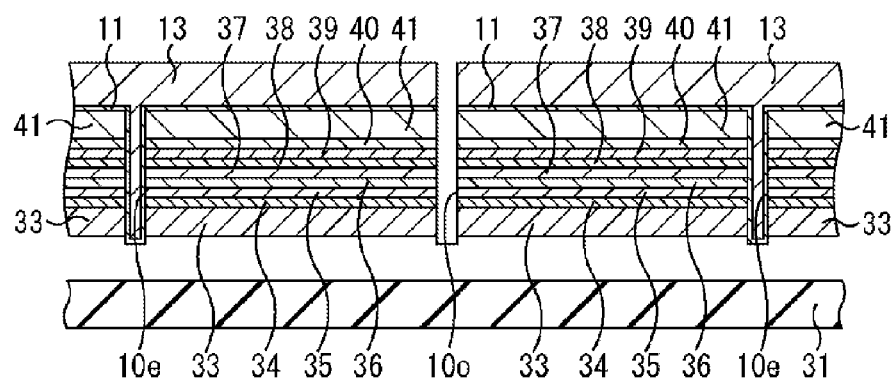

As illustrated in FIGS. 13D and 14C, the sacrificial layer 32 is removed by photoelectrochemical etching in the same way as in the first embodiment, thereby separating the substrate 31 from the etching stopper layer 33.

Figure 13E:
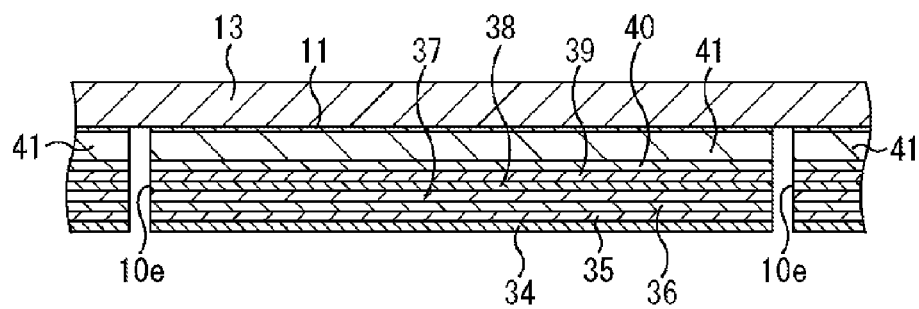
Figure 14D:
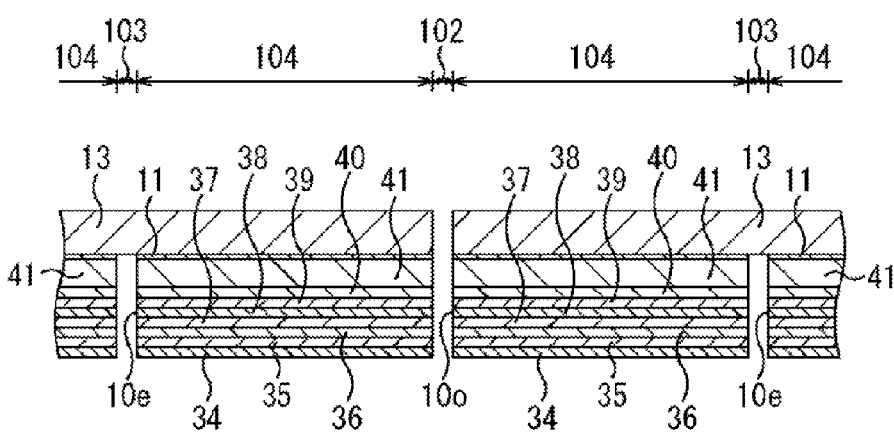

As illustrated in FIGS. 13E and 14D, the etching stopper layer 33 is removed in the same way as in the first embodiment. Furthermore, the Ti film 11 and the Ni film 13 arranged in the electrode grooves 10e and protruding from the electrode grooves 10e are removed.

Figure 13F:
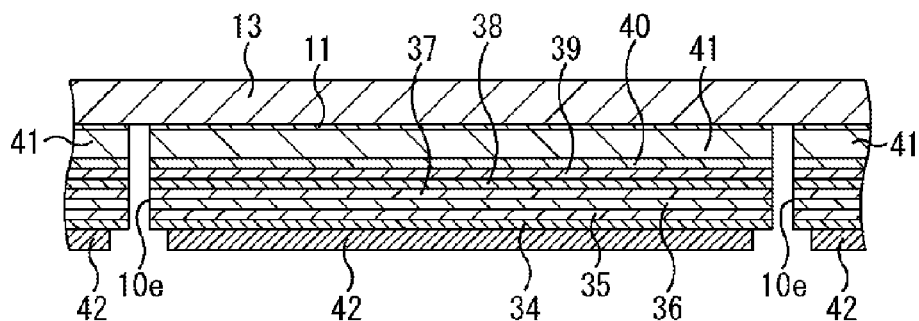
Figure 14E:
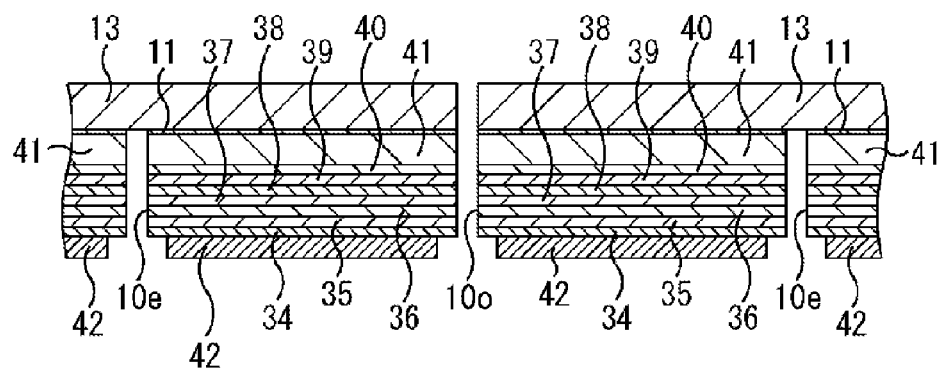

As illustrated in FIGS. 13F and 14E, electrodes 42 are formed over the back surface of the p-GaN layer 34. In the formation of the electrodes 42, for example, a resist film may be formed in the penetrating grooves 10o and the electrode grooves 10e in order not to contaminate the penetrating grooves 10o and the electrode grooves 10e and then removed after the formation of the electrodes 42. As the electrodes 42, for example, a laminate including a Ni film and a Au film provided thereover is formed, the Ni film having a thickness of about 200 nm, and the Au film having a thickness of about 300 nm. For example, heat treatment is performed in a nitrogen atmosphere at 400° C. to 1000° C. (e.g., about 600° C.). Thereby, ohmic properties of the electrodes 42 are established.

Figure 13G:
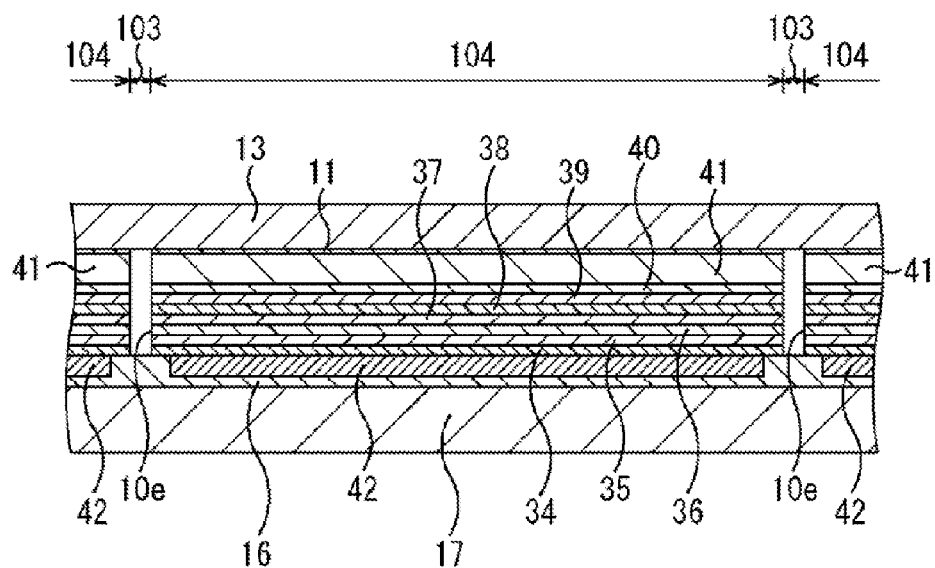
Figure 14F:
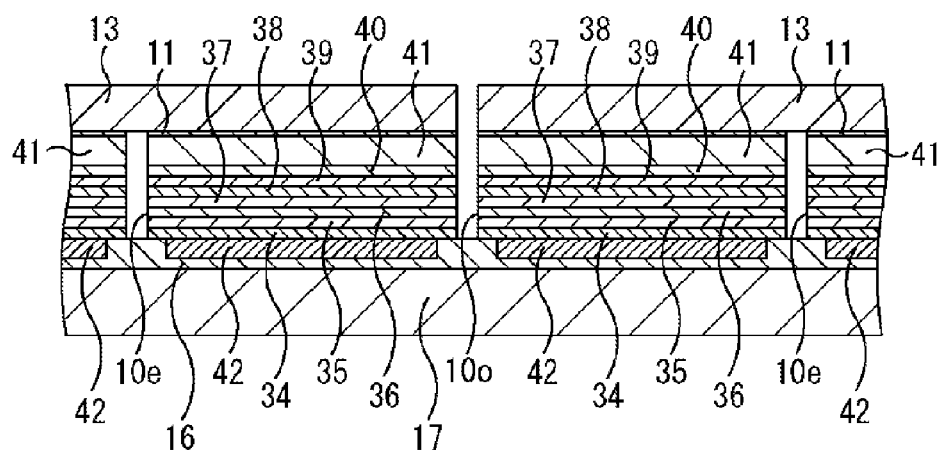

As illustrated in FIGS. 13G and 14F, for example, the conductive substrate 17 is bonded to the electrodes 42 and the p-GaN layer 34 with the conductive brazing material 16. The conductive substrate 17 has a conductivity of, for example, 30 W/(m·K) or more. As the conductive substrate 17, for example, a low-resistance Si substrate may be used.

Figure 13H:
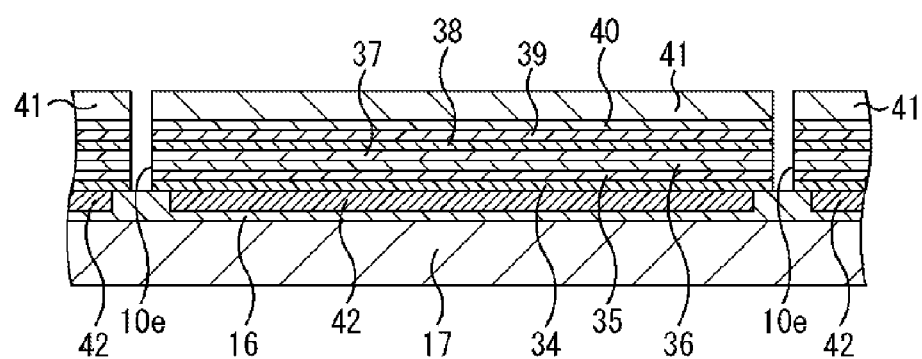
Figure 14G:
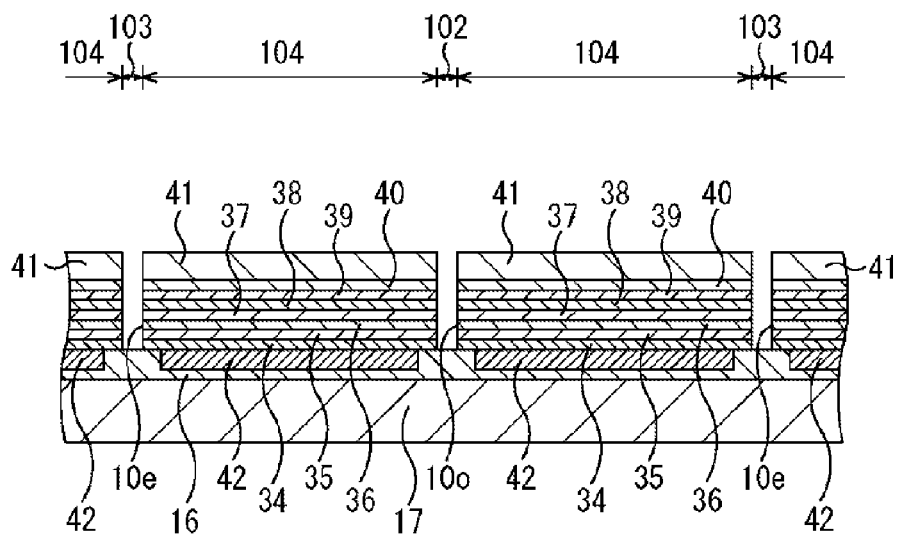

As illustrated in FIGS. 13H and 14G, the Ni film 13 and the Ti film 11 are removed.

Figure 13I:
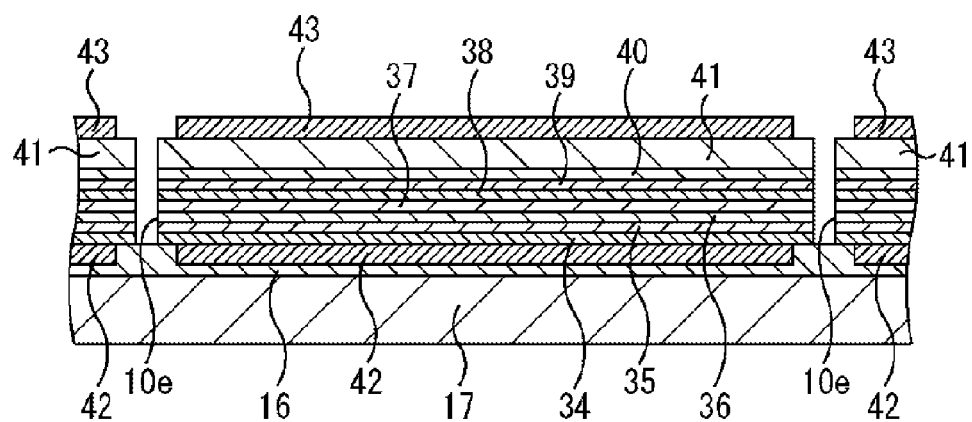
Figure 14H:
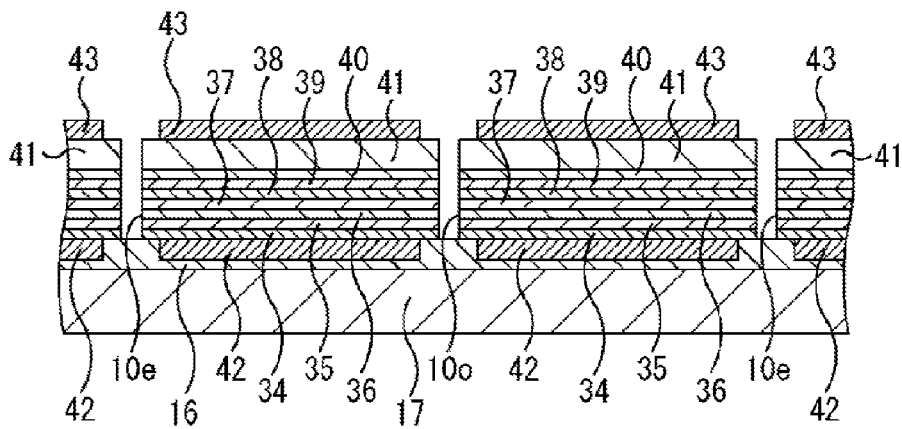

As illustrated in FIGS. 13I and 14H, the electrodes 43 are formed on the n-GaN layer 41. In the formation of the electrodes 43, for example, a resist film may be formed in the penetrating grooves 10o and the electrode grooves 10e in order not to contaminate the penetrating grooves 10o and the electrode grooves 10e and then removed after the formation of the electrodes 43. As the electrodes 43, for example, a laminate including a Ti film and an Al film provided thereover is formed, the Ti film having a thickness of about 100 nm, and the Al film having a thickness of about 200 nm. For example, heat treatment is performed in a nitrogen atmosphere at 400° C. to 1000° C. (e.g., about 600° C.). Thereby, ohmic properties of the electrodes 43 are established. In this way, a compound semiconductor device is produced.

Fifth Embodiment

A fifth embodiment will be described below. In the fifth embodiment, the transistor regions 101 having the layout illustrated in FIGS. 1 and 2 are arranged. However, the penetrating groove regions 102 and the electrode groove regions 103 may not be arranged.

Figure 15A:
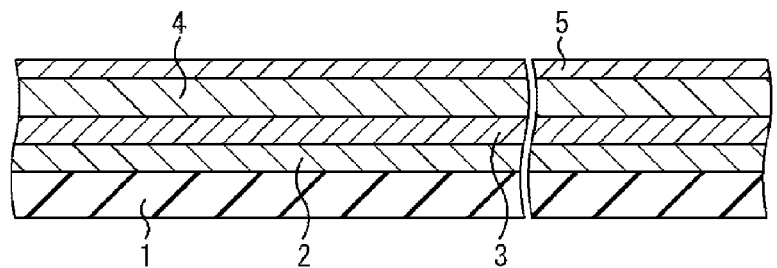
FIGS. 15A to 15J are cross-sectional views taken along line I-I in FIG. 2 and illustrate a method of manufacturing a compound semiconductor device according to a fifth embodiment.

As illustrated in FIG. 15A, the electron supply layer 5 is formed in substantially the same way as in the first embodiment.

Figure 15B:
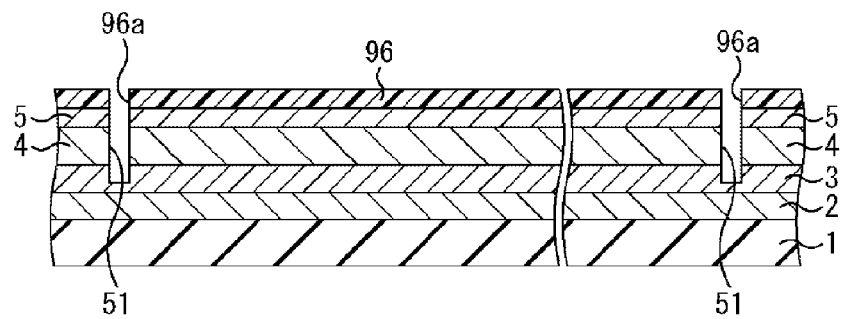

As illustrated in FIG. 15B, a resist pattern 96 having, for example, a circumferential opening 96a that surrounds all transistor regions 101 in plan view is formed over the electron supply layer 5. The electron supply layer 5, the electron transport layer 4, and the etching stopper layer 3 are partially subjected to dry etching with the resist pattern 96 as a mask, thereby forming a groove 51 matched to the opening 96a. Note that the groove 51 may extend to the sacrificial layer 2.

Figure 15C:
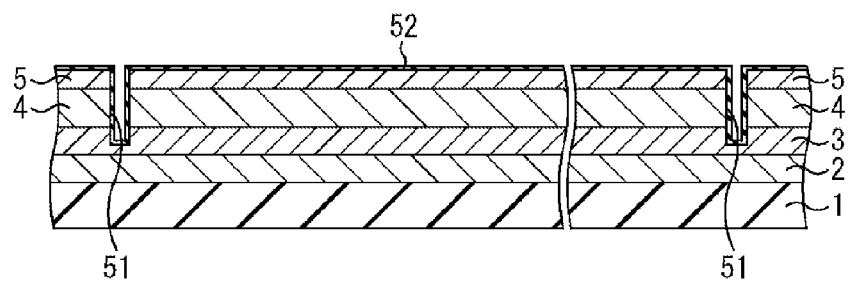

As illustrated in FIG. 15C, a passivation film 52 is formed so as to cover the bottom and sides of the groove 51 and the surface of the electron supply layer 5. As the passivation film 52, for example, a silicon nitride film having a thickness of 10 nm to 1000 nm (e.g., 500 nm) is formed by CVD.

Figure 15D:
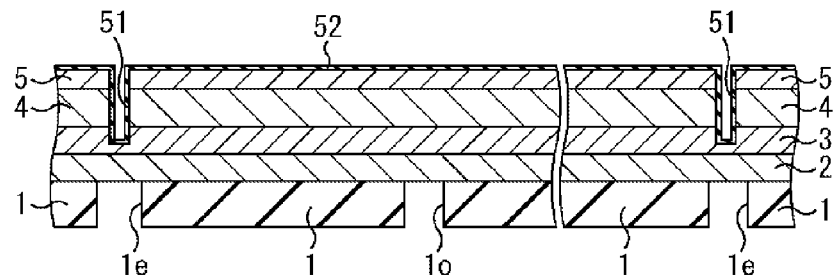

As illustrated in FIG. 15D, a penetrating groove 1o and electrode grooves 1e that extend to the sacrificial layer 2 are formed in the substrate 1. The penetrating groove 1o and the electrode grooves 1e may be formed by, for example, laser ablation with YAG laser. Alternatively, they may be formed by reactive ion etching. For example, they may be formed by wet etching with sulfuric acid and phosphoric acid heated to about 280° C.

Figure 15E:
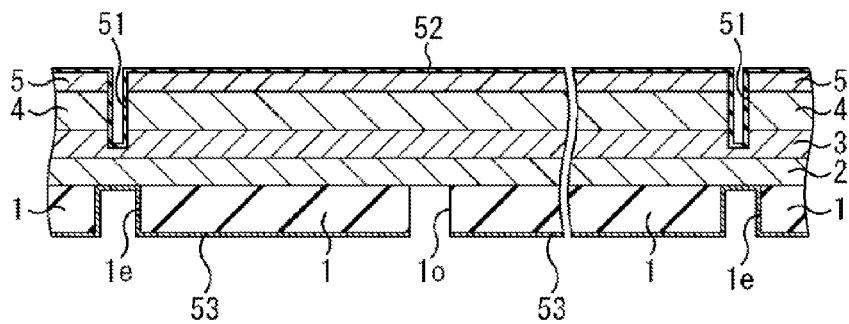

As illustrated in FIG. 15E, a conductive film 53 is formed in the electrode grooves 1e and over the back surface of the substrate 1. In the formation of the conductive film 53, for example, a Ti film having a thickness of about 100 nm is formed, and then a Au film having a thickness of about 100 nm is formed there over. The conductive film 53 is formed by, for example, the lift-off method so as not to be formed in the penetrating groove 1o.

Figure 15F:
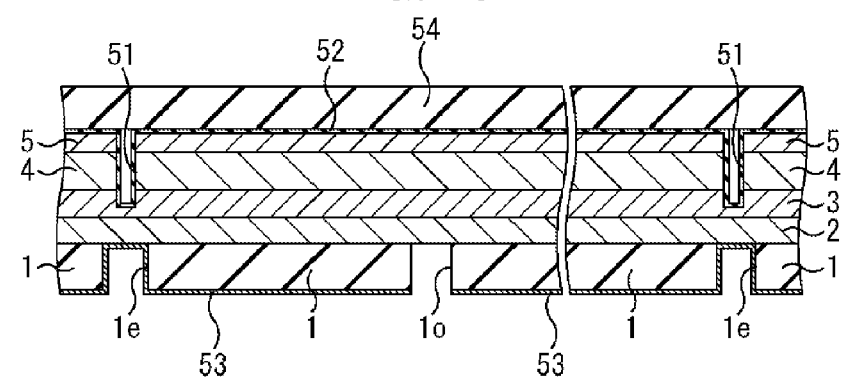

As illustrated in FIG. 15F, for example, a supporting substrate 54 capable of transmitting ultraviolet rays is bonded to the passivation film 52. As the supporting substrate 54, for example, a sapphire substrate or a quartz substrate may be used.

Figure 15G:
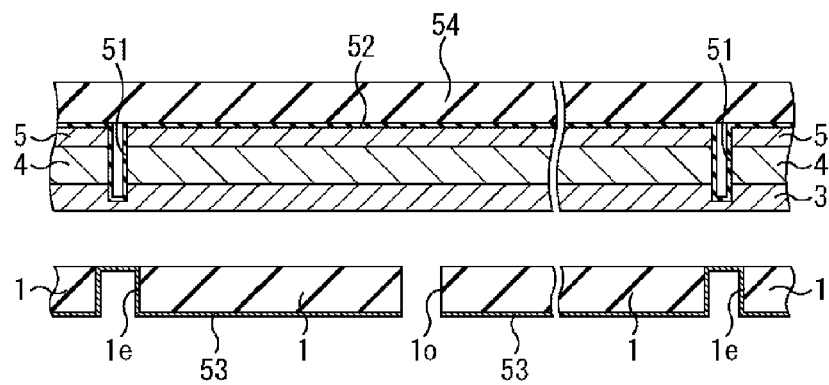
Figure 16:
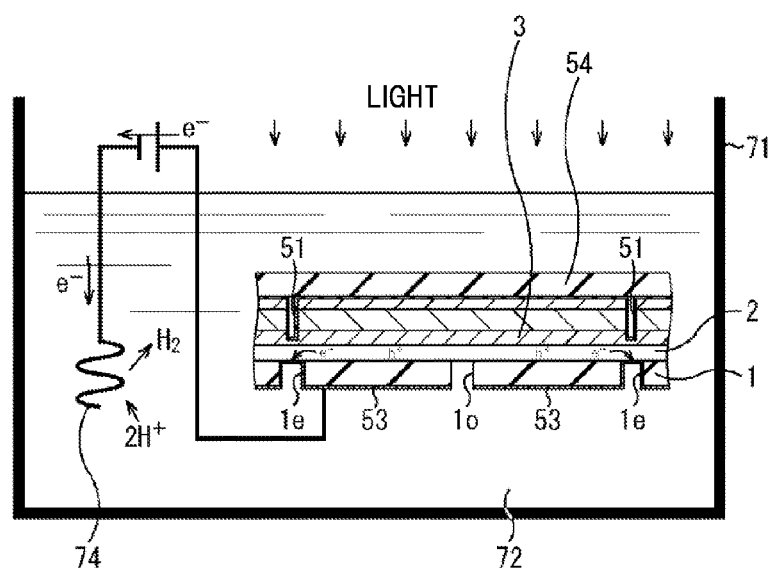
FIG. 16 is a schematic view illustrating a method of photoelectrochemical etching according to the fifth embodiment.

As illustrated in FIG. 15G, the sacrificial layer 2 is removed by photoelectrochemical etching, thereby separating the substrate 1 from the etching stopper layer 3. In this embodiment, as illustrated in FIG. 16, the conductive film 53 is connected to the positive electrode of the DC power supply 73. Thus, a potential of the positive electrode of the DC power supply 73 is applied to the sacrificial layer 2 through the conductive film 53. Furthermore, in this embodiment, the KOH solution 72 is in contact with the sacrificial layer 2 through the penetrating groove 1o. Then the voltage of the DC power supply 73 is set to, for example, 0 V to +2 V. The sacrificial layer 2 is irradiated with light through the supporting substrate 54 and so forth. Thereby, the sacrificial layer 2 is rapidly etched by reactions substantially the same as those in the first embodiment. Although portions of the electron transport layer 4 and the electron supply layer 5 located outside the groove 51 may also be etched, portions of the electron transport layer 4 and the electron supply layer 5 located inside the groove 51 are not etched. This is because the passivation film 52 prevents the KOH solution 72 from coming into contact with the electron transport layer 4 and the electron supply layer 5.

Figure 15H:
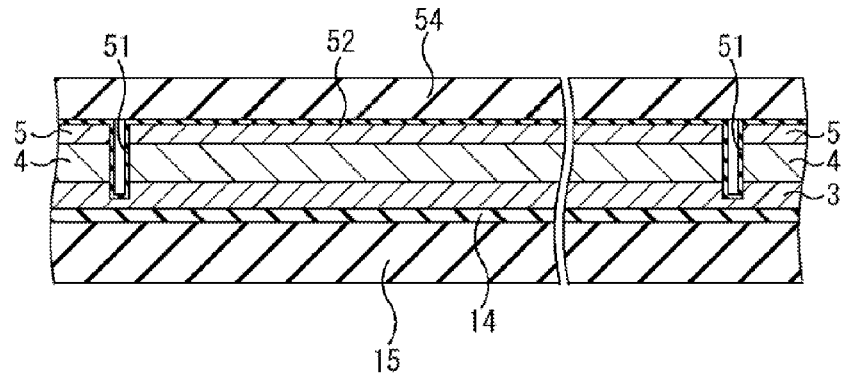

As illustrated in FIG. 15H, for example, the heat-dissipating substrate 15 having a higher thermal conductivity than the substrate 1 is bonded to the etching stopper layer 3 with the adhesive 14.

Figure 15I:
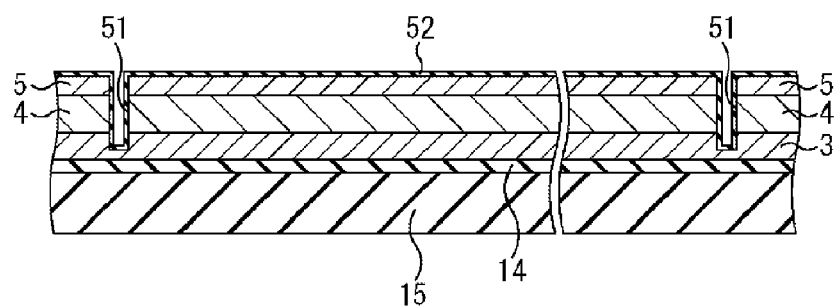

As illustrated in FIG. 15I, the supporting substrate 54 is removed.

Figure 15J:
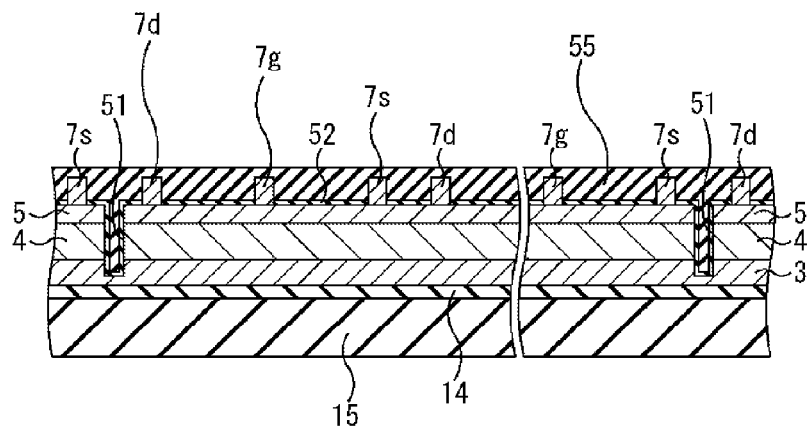

As illustrated in FIG. 15J, the gate electrode 7g, source electrode 7s, the drain electrode 7d are formed in substantially the same way as in the first embodiment. A passivation film 55 is formed so as to cover the gate electrode 7g, the source electrode 7s, and the drain electrode 7d. Wiring for the gate electrodes 7g, wiring for the source electrodes 7s, wiring for the drain electrodes 7d, and so forth are formed. Thereby, a compound semiconductor device is produced.

The sacrificial layer 2 is irradiated with light not through the substrate 1 but through the supporting substrate 54; hence, it is possible to use a conductive substrate as the substrate 1. In the case of using the conductive substrate as the substrate 1, the conductive film 53 may not be formed, and the positive electrode of the DC power supply 73 may be connected to the substrate 1.

Note that in any embodiment, the penetrating grooves may not be formed. This is because although the time required for the dissolution of the sacrificial layer during the photoelectrochemical etching is prolonged, it is possible to dissolve the sacrificial layer from the periphery of the substrate to the center.

In addition, the lattice constants of the compound semiconductor layers (e.g., the electron transport layer) formed over the etching stopper layer are preferably larger than that of the etching stopper layer. The reason for this is as follows: Compressive stress is present in these compound semiconductor layers arranged on the etching stopper layer. Removal of the etching stopper layer releases the compressive stress, so that the compound semiconductor layers extend slightly, resulting in preferred warpage.

Furthermore, the compositions of the sacrificial layer and the etching stopper layer are not limited to those described above. For example, as the sacrificial layer (first compound semiconductor layer), a layer containing $Al_xGa_{1-x}N$ ($0 \le x < 1$) may be used. As the etching stopper layer (second compound semiconductor layer), a layer containing $Al_yIn_zGa_{1-y-z}N$ ($0 < y < 1$, $0 < y+z \le 1$) may be used. Moreover, compound semiconductors other than GaN-based and AlInN-based compounds may be used.

The material of the substrate bonded is not limited to those described above. For example, polycrystalline SiC, Si, AlN, BN, graphite, or diamond-like carbon may be used. Alternatively, a ceramic material containing AlN, BN, and/or BeO may be used. Furthermore, the device may be mounted over a mounting board. In particular, in the case where the source electrodes extend to the back surface as in the second embodiment, it is preferred to connect the source electrodes to electrodes provided over the mounting board.

In addition, the materials of the electron transport layer and the electron supply layer are not limited. For example, the electron transport layer may contain $Al_sGa_{1-s}N$ ($0 \le s < 1$), and the electron supply layer may contain an n-type $Al_tGa_{1-t}N$ ($0 < t \le 1$, $s < t$). However, the band gap of the electron supply layer is preferably larger than that of the electron transport layer.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments in accordance with aspects of the present inventions have been described in detail, it should be understood that various changes, substitutions, and alterations could be made hereto without departing from the spirit and scope of the invention.

What is claimed is:

1. A method for manufacturing a compound semiconductor device comprising:
    forming a first compound semiconductor layer over a first substrate, the first compound semiconductor layer containing $Al_xGa_{1-x}N$ ($0 \le x < 1$) having a first band gap;
    forming a second compound semiconductor layer over the first compound semiconductor layer, the second compound semiconductor layer containing $Al_yIn_zGa_{1-y-z}N$ ($0 < y < 1$, $0 < z < 1$, $0 < y+z \le 1$) having a second band gap larger than the first band gap;
    forming a compound semiconductor laminated structure over the second compound semiconductor layer;
    forming a groove through the compound semiconductor laminated structure and the second compound semiconductor layer to expose the first compound semiconductor layer;
    forming a conductive film on the inside of the groove and the compound semiconductor laminated structure;
    removing the first compound semiconductor layer in an electrolytic solution containing potassium hydroxide;
    while applying a positive potential to the first compound semiconductor layer through the conductive film, and
    irradiating the first compound semiconductor layer with light having an energy between the first band gap and the second band gap, separating the first substrate from the compound semiconductor laminated structure.

2. The method according to claim 1, further comprising:
    after the separation of the first substrate from the compound semiconductor laminated structure, bonding a second substrate to the compound semiconductor laminated structure, the second substrate having a thermal conductivity higher than the first substrate.

3. The method according to claim 1, further comprising:
    after the separation of the first substrate from the compound semiconductor laminated structure, bonding a conductive substrate to the compound semiconductor laminated structure.

4. The method according to claim 1, wherein the removal of the first compound semiconductor layer is performed by applying a potential to the first compound semiconductor layer, the potential being higher than that applied to the electrolytic solution.

5. The method according to claim 4, wherein a concentration of the potassium hydroxide is in the range of 0.001 mol/L to 10 mol/L, and
    wherein a positive potential 2 V or less higher than a potential applied to the electrolytic solution is applied to the first compound semiconductor layer.

6. The method according to claim 1, further comprising:
    forming a third compound semiconductor layer on the second compound semiconductor layer, the third compound semiconductor layer having a larger lattice constant than the second compound semiconductor layer.

7. The method according to claim 1, further comprising:
    forming an electron transport layer; and
    forming an electron supply layer on the electron transport layer.

8. The method according to claim 7, wherein the electron transport layer has a larger lattice constant than the second compound semiconductor layer and is formed over the second compound semiconductor layer.

9. The method according to claim 1, wherein the compound semiconductor laminated structure is included in a lateral high-electron-mobility transistor.

10. The method according to claim 1, wherein the compound semiconductor laminated structure is included in a vertical high-electron-mobility transistor.

11. The method according to claim 1, wherein the compound semiconductor laminated structure is included in a semiconductor laser.

12. The method according to claim 1, wherein the second compound semiconductor layer comprises Al and In, and a proportion of Al with respect to the total amount of Al and In in the second compound semiconductor layer is 73 atomic percent or more and less than 100 atomic percent.

13. The method according to claim 1, wherein the light has a wavelength of 253 nm to 365 nm.

* * * * *